(12) United States Patent
Yang et al.

(10) Patent No.: US 12,712,032 B2
(45) Date of Patent: Aug. 18, 2026

(54) APPARATUS AND METHODS FOR IN-PLACE READ REFRESH FOR NONVOLATILE MEMORY DEVICES

(71) Applicant: Sandisk Technologies, Inc., Milpitas, CA (US)

(72) Inventors: Xiang Yang, Santa Clara, CA (US); Wei Cao, Fremont, CA (US); Deepanshu Dutta, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 87 days.

(21) Appl. No.: 18/660,336

(22) Filed: May 10, 2024

(65) Prior Publication Data

US 2025/0259689 A1 Aug. 14, 2025

Related U.S. Application Data

(60) Provisional application No. 63/552,778, filed on Feb. 13, 2024.

(51) Int. Cl.

*G11C 16/34* (2006.01)
*G11C 16/10* (2006.01)
*G11C 16/28* (2006.01)

(52) U.S. Cl.

CPC ........ *G11C 16/3422* (2013.01); *G11C 16/102* (2013.01); *G11C 16/28* (2013.01); *G11C 16/3459* (2013.01)

(58) Field of Classification Search

CPC ... G11C 16/3422; G11C 16/102; G11C 16/28; G11C 16/3459; G11C 11/5628; G11C 11/5642; G11C 11/5671; G11C 16/0483; G11C 16/08; G11C 16/10; G11C 16/26; G11C 16/3427

See application file for complete search history.

(56) References Cited

U.S. PATENT DOCUMENTS

| | | | | |
|---|---|---|---|---|
| 2019/0294358 | A1* | 9/2019 | Suzuki | G06F 3/064 |
| 2021/0166743 | A1* | 6/2021 | Itagaki | G11C 7/1048 |
| 2022/0310166 | A1* | 9/2022 | Ning | G11C 16/08 |
| 2024/0152279 | A1* | 5/2024 | Tseng | G11C 16/10 |

* cited by examiner

*Primary Examiner* — Amir Zarabian
*Assistant Examiner* — Bradley S Coon
(74) *Attorney, Agent, or Firm* — Dickinson Wright PLLC

(57) ABSTRACT

The memory device includes a memory block with an array of memory cells that are arranged in a plurality of word lines. The memory cells are programmed to one bit per memory cell with each memory cell being either in an erased data state or a programmed data state. The memory device also includes circuitry that is configured to determine that the memory cells have experienced significant read disturb. Without erasing the memory cells, the circuitry is further configured to program the memory cells in the programmed data state directly to higher threshold voltages to increase a threshold voltage margin between the memory cells in the erased data state and the memory cells in the programmed data state.

17 Claims, 21 Drawing Sheets

Figure 5B:
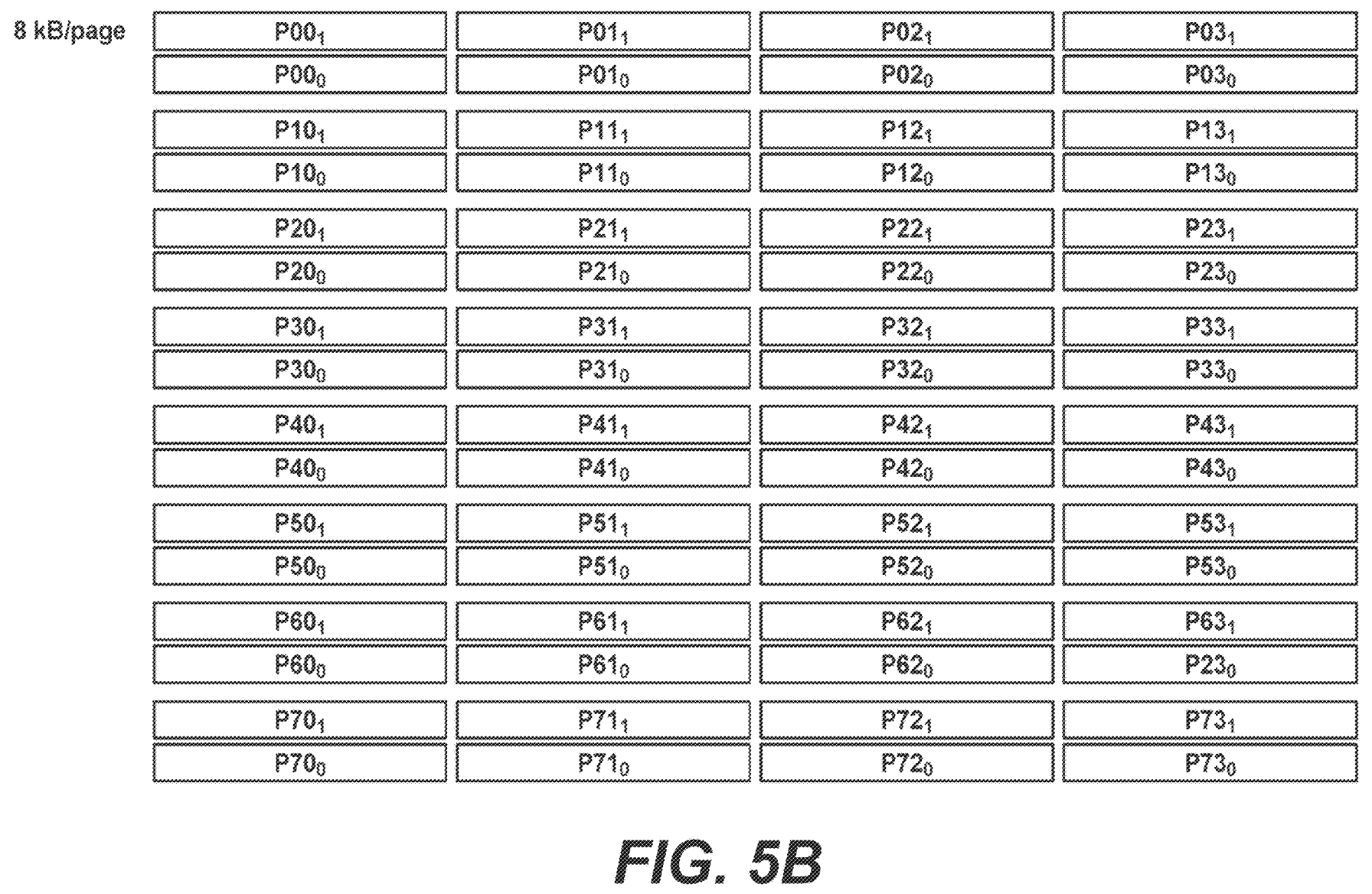

8 kB/page $P00_1$ $P01_1$ $P02_1$ $P03_1$
$P00_0$ $P01_0$ $P02_0$ $P03_0$ $P10_1$ $P11_1$ $P12_1$ $P13_1$
$P10_0$ $P11_0$ $P12_0$ $P13_0$ $P20_1$ $P21_1$ $P22_1$ $P23_1$
$P20_0$ $P21_0$ $P22_0$ $P23_0$ $P30_1$ $P31_1$ $P32_1$ $P33_1$
$P30_0$ $P31_0$ $P32_0$ $P33_0$ $P40_1$ $P41_1$ $P42_1$ $P43_1$
$P40_0$ $P41_0$ $P42_0$ $P43_0$ $P50_1$ $P51_1$ $P52_1$ $P53_1$
$P50_0$ $P51_0$ $P52_0$ $P53_0$ $P60_1$ $P61_1$ $P62_1$ $P63_1$
$P60_0$ $P61_0$ $P62_0$ $P23_0$ $P70_1$ $P71_1$ $P72_1$ $P73_1$
$P70_0$ $P71_0$ $P72_0$ $P73_0$

FIG. 5B 4 kB/page

| | | | | | | | |
|---|---|---|---|---|---|---|---|
| $P00_1$ | $P01_1$ | $P02_1$ | $P03_1$ | $P04_1$ | $P05_1$ | $P06_1$ | $P07_1$ |
| $P00_0$ | $P01_0$ | $P02_0$ | $P03_0$ | $P04_0$ | $P05_0$ | $P06_0$ | $P07_0$ |
| $P10_1$ | $P11_1$ | $P12_1$ | $P13_1$ | $P14_1$ | $P15_1$ | $P16_1$ | $P17_1$ |
| $P10_0$ | $P11_0$ | $P12_0$ | $P13_0$ | $P14_0$ | $P15_0$ | $P16_0$ | $P17_0$ |
| $P20_1$ | $P21_1$ | $P22_1$ | $P23_1$ | $P24_1$ | $P25_1$ | $P26_1$ | $P27_1$ |
| $P20_0$ | $P21_0$ | $P22_0$ | $P23_0$ | $P24_0$ | $P25_0$ | $P26_0$ | $P27_0$ |
| $P30_1$ | $P31_1$ | $P32_1$ | $P33_1$ | $P34_1$ | $P35_1$ | $P36_1$ | $P37_1$ |
| $P30_0$ | $P31_0$ | $P32_0$ | $P33_0$ | $P34_0$ | $P35_0$ | $P36_0$ | $P37_0$ |

FIG. 5C 2 kB/page

| | | | | | | | |
|---|---|---|---|---|---|---|---|
| $P00_1$ | $P01_1$ | $P02_1$ | $P03_1$ | $P04_1$ | $P05_1$ | $P06_1$ | $P07_1$ |
| $P00_0$ | $P01_0$ | $P02_0$ | $P03_0$ | $P04_0$ | $P05_0$ | $P06_0$ | $P07_0$ |
| $P10_1$ | $P11_1$ | $P12_1$ | $P13_1$ | $P14_1$ | $P15_1$ | $P16_1$ | $P17_1$ |
| $P10_0$ | $P11_0$ | $P12_0$ | $P13_0$ | $P14_0$ | $P15_0$ | $P16_0$ | $P17_0$ |
| $P20_1$ | $P21_1$ | $P22_1$ | $P23_1$ | $P24_1$ | $P25_1$ | $P26_1$ | $P27_1$ |
| $P20_0$ | $P21_0$ | $P22_0$ | $P23_0$ | $P24_0$ | $P25_0$ | $P26_0$ | $P27_0$ |
| $P30_1$ | $P31_1$ | $P32_1$ | $P33_1$ | $P34_1$ | $P35_1$ | $P36_1$ | $P37_1$ |
| $P30_0$ | $P31_0$ | $P32_0$ | $P33_0$ | $P34_0$ | $P35_0$ | $P36_0$ | $P37_0$ |

FIG. 5D

APPARATUS AND METHODS FOR IN-PLACE READ REFRESH FOR NONVOLATILE MEMORY DEVICES

CROSS-REFERENCE TO RELATED APPLICATION

This application claims priority to and the benefit of U.S. Provisional App. No. 63/552,778, filed Feb. 13, 2024, entitled "APPARATUS AND METHODS FOR IN-PLACE READ REFRESH FOR NONVOLATILE MEMORY DEVICES," the entire contents of which is herein incorporated by reference.

BACKGROUND

1. Field

The present disclosure is related generally to non-volatile memory and, more particularly to improved memory devices that are optimized to operate at very high read performance and with a very low power consumption.

2. Related Art

Semiconductor memory is widely used in various electronic devices such as cellular telephones, digital cameras, personal digital assistants, medical electronics, mobile computing devices, servers, solid state drives, non-mobile computing devices and other devices. Semiconductor memory may be non-volatile memory or volatile memory. A non-volatile memory allows information to be stored and retained even when the non-volatile memory is not connected to a source of power (e.g., a battery).

Non-volatile memory devices include one or more memory chips having multiple arrays of memory cells. The memory arrays may have associated decoders and circuits for performing read, write, and erase operations. Memory cells within the arrays may be arranged in horizontal rows and vertical columns. Each row may be addressed by a word line, and each column may be addressed by a bit line. Data may be loaded into columns of the array using a series of data busses. Each column may hold a predefined unit of data, for instance, a word encompassing two bytes of information.

In some applications, semiconductor memory is used to store very large amounts of data that are repeatedly accessed (e.g., read) very rapidly. For example, in some machine learning applications, large language models that include a terabyte (or more) of data must be stored in memory and retrieved at a very high data rate. Accordingly, such applications require very high bandwidth and low power.

Currently, high bandwidth volatile memory devices (e.g., DRAM memory devices called "high bandwidth memory" or "HBM") are used for such applications. Non-volatile memory (e.g., NAND) is significantly less expensive than DRAM, but the bandwidth of conventional NAND memory devices is too low, and the power consumption of conventional NAND memory devices is too high to provide a viable alternative to HBM devices. Therefore, there is a need to provide high bandwidth, low power non-volatile memory.

SUMMARY

One aspect of the present disclosure is related to a method of operating a memory device. The method includes the step of preparing a memory device that includes a memory block with an array of memory cells that are arranged in a plurality of word lines. The memory cells are programmed to one bit per memory cell with each memory cell being either in an erased data state or a programmed data state. The method continues with the step of determining that the memory cells have experienced significant read disturb. Without erasing the memory cells, the method proceeds with the step of programming the memory cells in the programmed data state directly to higher threshold voltages to increase a threshold voltage margin between the memory cells in the erased data state and the memory cells in the programmed data state.

According to another aspect of the present disclosure, the method further includes the steps of counting a number of read cycles to establish a read cycle count and comparing the read count cycle to a predetermined threshold. The step of determining that the memory cells have experienced significant read disturb occurs in response to the read cycle count exceeding the predetermined threshold.

According to yet another aspect of the present disclosure, the step of determining that the memory cells have experienced significant read disturb occurs in response to a determination that a count of memory cells in a voltage range that is below a voltage range associated with the programmed data state is greater than a predetermined threshold.

According to still another aspect of the present disclosure, the method further includes the step of setting a reference voltage SLCR for use during read operations from a first level to a higher second level following the step of programming the memory cells in the programmed data state to the higher threshold voltages.

According to a further aspect of the present disclosure, the step of programming the memory cells in the programmed data state to higher threshold voltages includes applying a programming voltage to a selected word line; setting a plurality of bit lines that are electrically coupled with the memory cells of the selected word line and that are in the programmed data state at very low voltages; and setting a plurality of bit lines that are electrically coupled with the memory cells of the selected word line and that are in the erased data state at inhibit voltages.

According to yet a further aspect of the present disclosure, the step of programming the memory cells in the programmed data state directly to higher threshold voltages includes a single programming pulse and no verify operations or includes multiple programming pulses and verify operations.

Another aspect of the present disclosure is related to a memory device. The memory device includes a memory block with an array of memory cells that are arranged in a plurality of word lines. The memory cells are programmed to one bit per memory cell with each memory cell being either in an erased data state or a programmed data state. The memory device also includes circuitry that is configured to determine that the memory cells have experienced significant read disturb. Without erasing the memory cells, the circuitry is further configured to program the memory cells in the programmed data state directly to higher threshold voltages to increase a threshold voltage margin between the memory cells in the erased data state and the memory cells in the programmed data state.

According to another aspect of the present disclosure, the circuitry is configured to count a number of read cycles to establish a read cycle count and compare the read count cycle to a predetermined threshold. The circuitry determines that the memory cells have experienced significant read disturb in response to the read cycle count exceeding the predetermined threshold.

According to yet another aspect of the present disclosure, the circuitry is further configured to set a reference voltage SLCR for use during read operations from a first level to a higher second level after programming the memory cells in the programmed data state to the higher threshold voltages.

According to still another aspect of the present disclosure, when programming the memory cells in the programmed data state to higher threshold voltages, the circuitry applies a programming voltage to a selected word line; sets a plurality of bit lines that are electrically coupled with the memory cells of the selected word line and that are in the programmed data state at very low voltages; and sets a plurality of bit lines that are electrically coupled with the memory cells of the selected word line and that are in the erased data state at inhibit voltages.

According to a further aspect of the present disclosure, the circuitry is configured to count a number of memory cells that have threshold voltages in a voltage range that is below a voltage range associated with the programmed data state; compare the count of memory cells that have threshold voltages in the voltage range that is below the voltage range associated with the programmed data state to a predetermined threshold; and determine that the memory cells have experienced significant read disturb in response to the count of memory cells being greater than the predetermined threshold.

According to yet a further aspect of the present disclosure, when programming the memory cells in the programmed data state directly to higher threshold voltages, the circuitry applies a single programming pulse to a selected word line without a following verify operation or applies multiple programming pulses to the selected word line with following verify operations.

Yet another aspect of the present disclosure is related to a computing system that includes a processor unit and a plurality of high bandwidth flash (HBF) packages in electrical communication with the processor unit. At least one of the HBF packages includes a memory block with an array of memory cells that are arranged in a plurality of word lines. The memory cells are programmed to one bit per memory cell with each memory cell being either in an erased data state or a programmed data state. The at least one of the HBF packages further includes circuitry that is configured to determine that the memory cells have experienced significant read disturb. Without erasing the memory cells, the circuitry is further configured to program the memory cells in the programmed data state directly to higher threshold voltages to increase a threshold voltage margin between the memory cells in the erased data state and the memory cells in the programmed data state.

According to another aspect of the present disclosure, the circuitry is configured to count a number of read cycles to establish a read cycle count and compare the read count cycle to a predetermined threshold. The circuitry determines that the memory cells have experienced significant read disturb in response to the read cycle count exceeding the predetermined threshold.

According to yet another aspect of the present disclosure, the circuitry is further configured to set a reference voltage SLCR for use during read operations from a first level to a higher second level after programming the memory cells in the programmed data state to the higher threshold voltages.

According to still another aspect of the present disclosure, when programming the memory cells in the programmed data state to higher threshold voltages, the circuitry applies a programming voltage to a selected word line; sets a plurality of bit lines that are electrically coupled with the memory cells of the selected word line and that are in the programmed data state at very low voltages; and sets a plurality of bit lines that are electrically coupled with the memory cells of the selected word line and that are in the erased data state at inhibit voltages.

According to a further aspect of the present disclosure, the circuitry is configured to count a number of memory cells that have threshold voltages in a voltage range that is below a voltage range associated with the programmed data state and compare the count of memory cells that have threshold voltages in the voltage range that is below the voltage range associated with the programmed data state to a predetermined threshold. The circuitry also determines that the memory cells have experienced significant read disturb in response to the count of memory cells being greater than the predetermined threshold.

According to yet a further aspect of the present disclosure, the plurality of HBF packages are able to electrically communicate with the processor unit at rates of greater than 3 TB/s.

According to still a further aspect of the present disclosure, the HBF packages receive supply voltages that are no greater than 1.2 V.

According to another aspect of the present disclosure, when programming the memory cells in the programmed data state directly to higher threshold voltages, the circuitry applies a single programming pulse to a selected word line without a following verify operation or applies multiple programming pulses to the selected word line with verify operations.

BRIEF DESCRIPTION OF THE DRAWINGS

These and other features and advantages of the subject disclosure will become more readily appreciated when considered in connection with the following description of the presently preferred embodiments, appended claims and accompanying drawings, in which:

FIG. 5B is a block diagram of one embodiment of a memory structure having thirty-two planes;

FIG. 5C is a block diagram of another embodiment of a memory structure having thirty-two planes;

FIG. 5D is a block diagram of still another embodiment of a memory structure having thirty-two planes;

DETAILED DESCRIPTION OF THE ENABLING EMBODIMENT

Technology is described for increasing the bandwidth and improving the power efficiency of NAND memory to provide a viable alternative to HBM devices. More specifically, as discussed in further detail below, a high bandwidth flash (HBF) package is provided that is specifically configured to operate at both a very high bandwidth (specifically, very high read performance) and with very low power consumption. The HBF package is thus optimized for use in large language model operations. Additionally, as described in further detail below, the HBF packages are configured to automatically refresh the data according stored therein to protect against read disturb without re-locating or even erasing the data.

Figure 1:
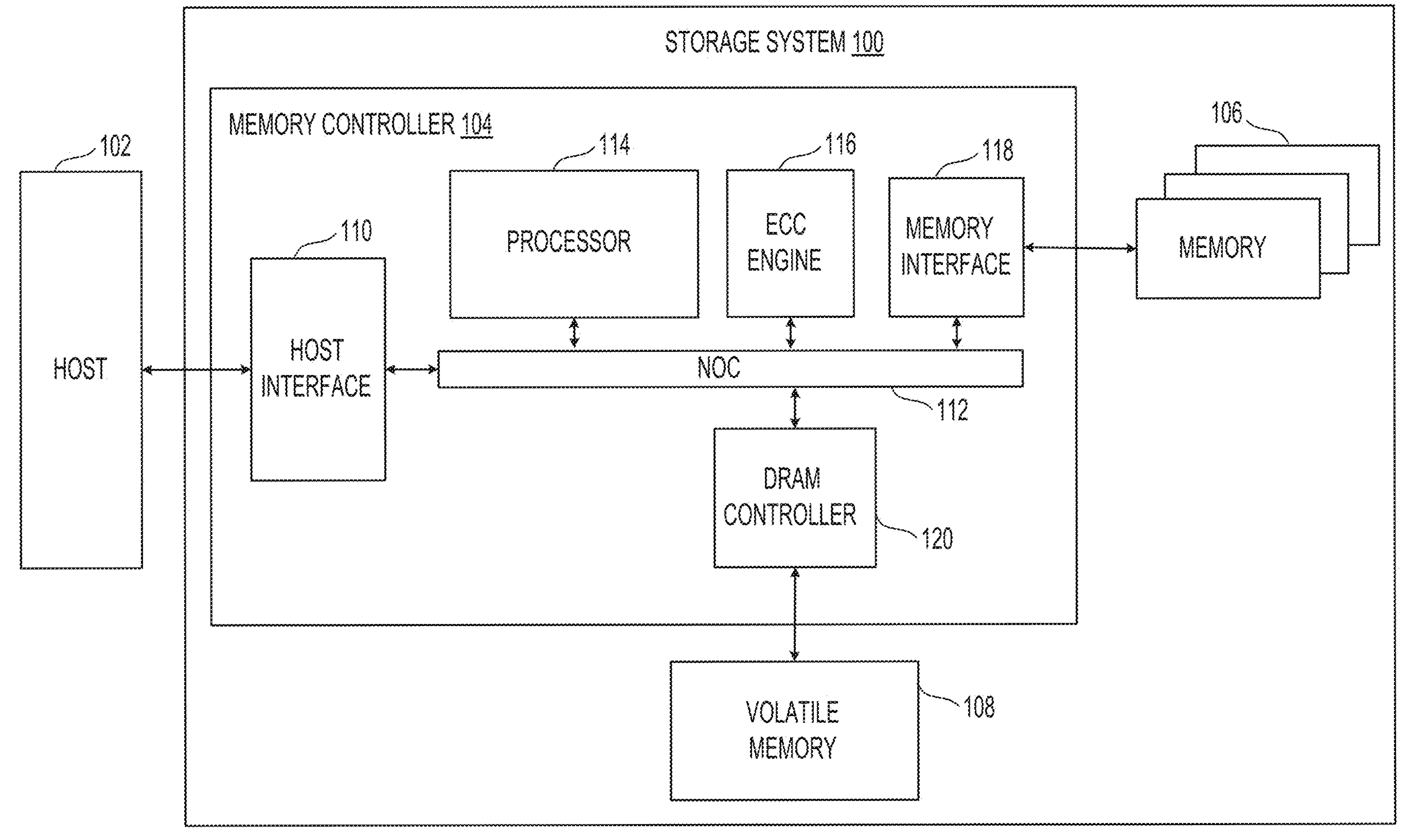
FIG. 1 is a block diagram depicting one embodiment of a storage system.

FIG. 1 is a block diagram of one embodiment of a storage system 100 that implements the proposed technology described herein. In one embodiment, the storage system 100 is a solid state drive ("SSD"). The storage system 100 also can be a memory card, a USB drive, or any other type of storage system. In other words, the proposed technology is not limited to any one type of memory system.

The storage system 100 is connected to a host 102, which can be a computer; server; electronic device (e.g., smart phone, tablet or other mobile device); appliance; or another apparatus that uses memory and has data processing capabilities. In some embodiments, the host 102 is separate from, but connected to, the storage system 100. In other embodiments, the storage system 100 is embedded within the host 102.

The components of the storage system 100 depicted in FIG. 1 are electrical circuits. The storage system 100 includes a memory controller 104 connected to non-volatile memory 106 and local high speed volatile memory 108 (e.g., DRAM). A local high speed volatile memory 108 is used by memory controller 104 to perform certain functions. For example, the local high speed volatile memory 108 stores logical to physical address translation tables ("L2P tables").

The memory controller 104 includes a host interface 110 that is connected to and in communication with the host 102. In one embodiment, a host interface 110 implements an NVM Express (NVMe) over PCI Express (PCIe). Other interfaces can also be used, such as SCSI, SATA, etc. The host interface 110 also is connected to a network-on-chip (NOC) 112.

An NOC is a communication subsystem on an integrated circuit. The NOC's can span synchronous and asynchronous clock domains or use un-clocked asynchronous logic. NOC technology applies networking theory and methods to on-chip communications and brings notable improvements over conventional bus and crossbar interconnections. The NOC improves the scalability of systems on a chip (SoC) and the power efficiency of complex SoCs compared to other designs.

The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, the NOC 112 can be replaced by a bus.

Connected to and in communication with NOC 112 is a processor 114, an ECC engine 116, a memory interface 118, and a DRAM controller 120. The DRAM controller 120 is used to operate and communicate with local high speed volatile memory 108 (e.g., DRAM). In other embodiments, the local high speed volatile memory 108 can be SRAM or another type of volatile memory.

In operation, the processor 114 performs the various controller memory operations, such as programming, erasing, reading, and memory management processes. In one embodiment, the processor 114 is programmed by firmware. In other embodiments, the processor 114 is a custom and dedicated hardware circuit without any software. The processor 114 also implements a translation module, as a software/firmware process or as a dedicated hardware circuit.

In many systems, the non-volatile memory is addressed internally to the storage system using physical addresses associated with one or more memory dies. However, the host system will use logical addresses to address the various memory locations. This enables the host to assign data to consecutive logical addresses, while the storage system is free to store the data as it wishes among the locations of the one or more memory dies. To implement this system, the memory controller 104 (e.g., the translation module) performs address translation between the logical addresses used by the host and the physical addresses used by the memory dies.

One example implementation is to maintain tables (i.e., the L2P tables referenced above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 108 cannot hold all of the L2P tables. In such a case, the entire set of L2P tables are stored in non-volatile memory 106 and a subset of the L2P tables are cached (L2P cache) in the local high speed volatile memory 108.

The ECC engine 116 performs error correction services. For example, the ECC engine 116 performs data encoding and decoding, as per an implemented ECC technique. In one embodiment, the ECC engine 116 is an electrical circuit programmed by software. For example, the ECC engine 116 can be a processor that can be programmed. In other embodiments, the ECC engine 116 is a custom and dedicated hardware circuit without any software. In another embodiment, the function of ECC engine 116 is implemented by the processor 114.

The memory interface 118 communicates with the non-volatile memory 106. In one embodiment, the memory interface provides a Toggle Mode interface. However, other interfaces also can be used. In some example implementations, the memory interface 118 (or another portion of the controller 104) implements a scheduler and buffer for transmitting data to and receiving data from one or more memory die.

Figure 2A:
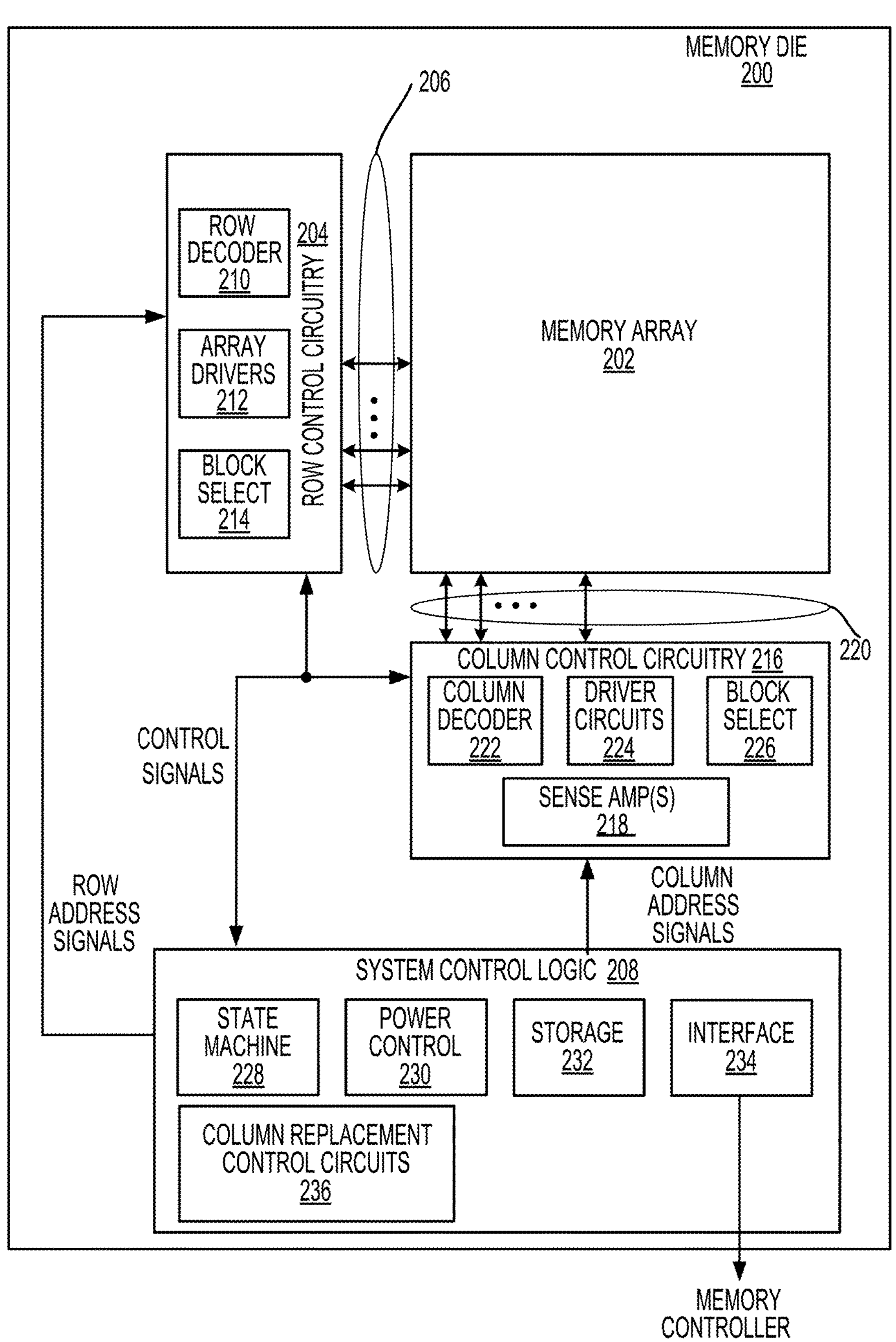
FIG. 2A is a block diagram of one embodiment of a memory die.

In one embodiment, the non-volatile memory 106 includes one or more memory die. FIG. 2A is a functional block diagrams of one embodiment of a memory die 200 that includes the non-volatile memory 106. Each of the one or more memory dies of non-volatile memory 106 can be implemented as the memory die 200 of FIG. 2A. The components depicted in FIG. 2A are electrical circuits.

The memory die 200 includes a memory array 202 that can include non-volatile memory cells, as described in further detail below. The memory array 202 includes a plurality of layers of word lines that are organized as rows, and a plurality of layers of bit lines that are organized as columns. However, other orientations can also be implemented.

The memory die 200 also includes row control circuitry 204, whose outputs 206 are connected to respective word lines of the memory array 202. In operation, the row control circuitry 204 receives a group of M row address signals and one or more various control signals from a system control logic circuit 208 and may include such circuits as row decoders 210, array terminal drivers 212, and block select circuitry 214 for both reading and writing (programming) operations.

The row control circuitry 204 also may include read/write circuitry. The memory die 200 also includes column control circuitry 216 including sense amplifier(s) 218 whose input/outputs 220 are connected to respective bit lines of the memory array 202. Although only a single block is shown for memory array 202, the memory die 200 can include multiple arrays that can be individually accessed.

The column control circuitry 216 receives a group of N column address signals and one or more various control signals from system control logic 208. The column control circuitry 216 may also include such circuits as column decoders 222; array terminal receivers or driver circuits 224; block select circuitry 226; read/write circuitry; and I/O multiplexers.

The system control logic 208 receives data and commands from memory controller 104 (FIG. 1) and provides output data and status to host 102. In some embodiments, the system control logic 208, which includes one or more electrical circuits, includes a state machine 228 that provides die-level control of memory operations. In one embodiment, the state machine 228 is programmable by software. In other embodiments, the state machine 228 does not use software and is completely implemented in hardware (e.g., electrical circuits). In another embodiment, the state machine 228 is replaced by a micro-controller or microprocessor, either on or off the memory chip.

The system control logic 208 also can include a power control module 230 that controls the power and voltages supplied to the rows and columns of memory structure 202 during memory operations and may include charge pumps and regulator circuits for creating regulating voltages. The system control logic 208 also includes storage 232 (e.g., RAM, registers, latches, etc.), which may be used to store parameters for operating memory array 202.

In operation, commands and data are transferred between the memory controller 104 and the memory die 200 via a memory controller interface 234 (also referred to as a "communication interface"). The memory controller interface 234 is an electrical interface for communicating with memory controller 104. Examples of the memory controller interface 234 include a Toggle Mode Interface and an Open NAND Flash Interface (ONFI). Other I/O interfaces can also be used in other embodiments.

In an embodiment, the system control logic 208 also includes column replacement control circuits 236, described in more detail below.

In some embodiments, all elements of the memory die 200, including the system control logic 208, can be formed as part of a single die. In other embodiments, some or all of the system control logic 208 can be formed on a different die.

In one embodiment, the memory structure 202 comprises a three-dimensional memory array of non-volatile memory cells in which multiple memory levels are formed above a single substrate, such as a wafer. The memory structure 202 may include any type of non-volatile memory that are monolithically formed in one or more physical levels of memory cells having an active area disposed above a silicon (or other type of) substrate. In one example, the non-volatile memory cells include charge-trapping layers and are arranged in a plurality of vertical NAND strings.

In another embodiment, the memory structure 202 includes a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. For example, suitable technologies for the memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of memory structure 202 include two dimensional arrays, three dimensional arrays, cross-point arrays, stacked two dimensional arrays, vertical bit line arrays, and the like. One example of a ReRAM cross-point memory includes reversible resistance-switching elements arranged in cross-point arrays accessed by X lines and Y lines (e.g., word lines and bit lines).

In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, and the ferromagnetic layers are separated by a thin insulating layer. One of the two ferromagnetic layers is a permanent magnet that is set to a particular polarity, and the other ferromagnetic layer's magnetization can be changed to match that of an external field to store memory. The memory array may be built from a grid of such memory cells. In one embodiment, for programming, each memory cell lies between a pair of write lines that are arranged at right angles to each other, parallel to the cell, one above and one below the cell. When current is passed through the write lines, an induced magnetic field is created. MRAM based memory embodiments will be discussed in more detail below.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

The technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) the memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202. However, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to system control logic 208, reduced availability of area can limit the available functions that can be implemented on-chip. Consequently, a basic trade-off in the design of a memory die for the storage system 100 may be the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based.

Elements such as the sense amplifier circuits, charge pumps, logic elements in a state machine, and other peripheral circuitry in the system control logic 208 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto a separately formed die that is then bonded together with another die. More specifically, the memory structure 202 can be formed on one die (referred to as the memory die) and some or all of the peripheral circuitry elements, including one or more control circuits, can be formed on a separate die (referred to as the control die). A memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology.

For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array.

The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
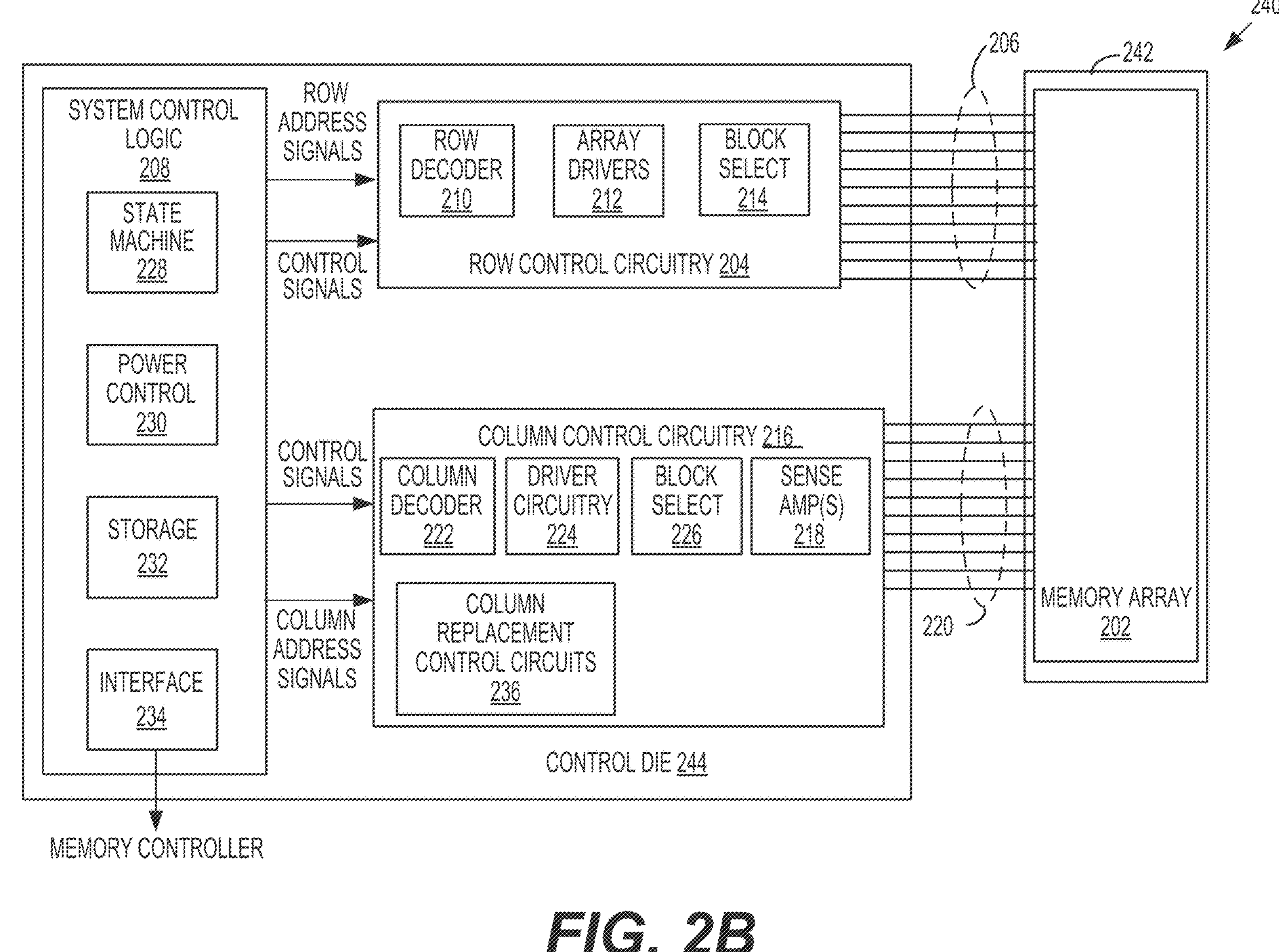
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 240. One or more integrated memory assemblies 240 may be used to implement the non-volatile memory 106 of storage system 100.

The integrated memory assembly 240 includes two types of semiconductor die (or more succinctly, "die"). The memory die 242 includes the memory structure 202 with the non-volatile memory cells. A control die 244 includes control circuitry 208, 216, and 204 (as described above). In some embodiments, the control die 244 is configured to connect to the memory structure 202 in the memory die 242. In some embodiments, the memory die 242 and control die 244 are bonded together.

FIG. 2B shows an example of the peripheral circuitry, including control circuits, formed in a peripheral circuit or control die 244 coupled to memory structure 202 formed in memory die 242. Common components are labelled similarly to FIG. 2A. The system control logic 208, the row control circuitry 204, and the column control circuitry 216 are located in the control die 244. In some embodiments, all or a portion of column control circuitry 216 and all or a portion of the row control circuitry 204 are located on memory die 242. In some embodiments, some of the circuitry in the system control logic 208 is located on the memory die 242.

The system control logic 208, the row control circuitry 204, and the column control circuitry 216 may be formed by a common process (e.g., CMOS process), so that adding elements and functions, such as the ECC controller, more typically found on a memory controller 104 may require few or no additional process steps, i.e., the same process steps used to fabricate controller 104 may also be used to fabricate the system control logic 208, the row control circuitry 204, and the column control circuitry 216.

Thus, while moving such circuits from a die such as the memory die 242 may reduce the number of steps needed to fabricate such a die, adding such circuits to a die such as control die 244 may not require many additional process steps. The control die 244 also could be referred to as a CMOS die, due to the use of CMOS technology to implement some or all of the control circuitry 204, 208, 216.

FIG. 2B shows column control circuitry 216, including the sense amplifier(s) 218, on control die 244 coupled to memory structure 202 on memory die 242 through electrical paths 220. The electrical paths 220 may provide an electrical connection between the column decoder 222, the driver circuitry 224, the block select 226, and the bit lines of the memory structure 202. In an embodiment, the column control circuitry 216 also includes column replacement control circuits 236, which are described in more detail below.

Electrical paths may extend from the column control circuitry 216 in the control die 244 through pads on the control die 244 that are bonded to corresponding pads of the memory die 242, which are connected to the bit lines of the memory structure 202. Each bit line of the memory structure 202 may have a corresponding one of the electrical paths 220, including a pair of bond pads, which connects to the column control circuitry 216.

Similarly, the row control circuitry 204, including the row decoder 210, the array drivers 212, and the block select 214 are coupled to the memory structure 202 through electrical paths 206. Each of the electrical paths 206 may correspond to a data containing word line, a dummy word line, or a select gate line. Additional electrical paths may also be provided between control die 244 and memory die 242.

For purposes of this document, the phrases "a control circuit," "control circuitry," or "one or more control circuits" can include any one of or any combination of the memory controller 104; the state machine 228; all or a portion of the system control logic 208; all or a portion of row control circuitry 204; all or a portion of column control circuitry 216; a microcontroller; a microprocessor; and/or other similar functioned circuits.

The control circuit can include hardware only or a combination of hardware and software (including firmware). For example, one or more controllers programmed by firmware to perform the functions described herein is one example of a control circuit. A control circuit can include a processor, FGA, ASIC, integrated circuit, or other type of circuit.

In some embodiments, there is more than one control die 244 and more than one memory die 242 in an integrated memory assembly 240. In some embodiments, the integrated memory assembly 240 includes a stack of multiple control dies 244 and multiple memory dies 242.

Figure 3A:
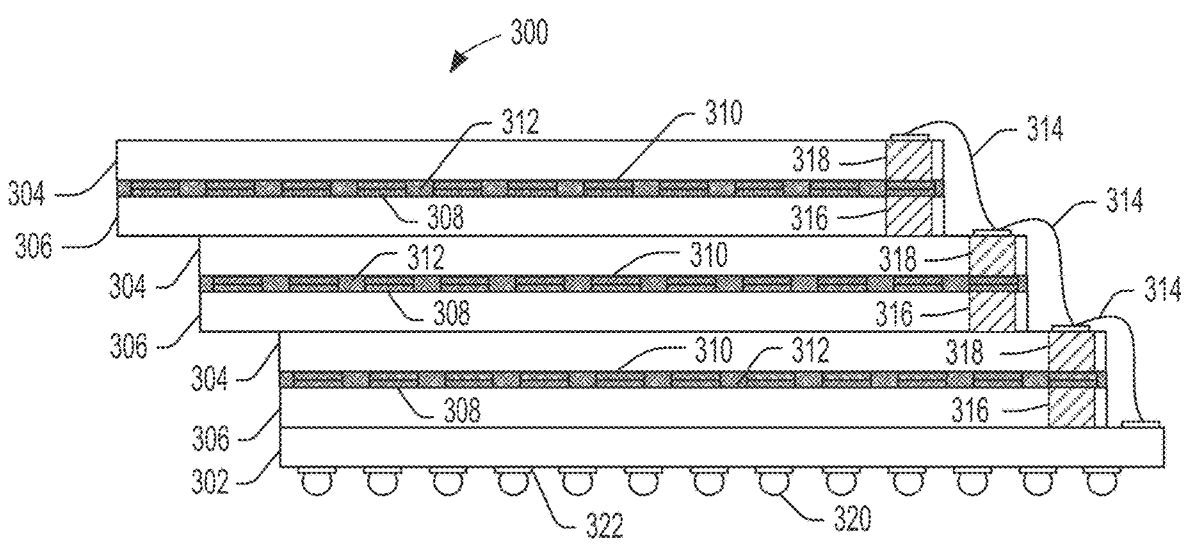
FIGS. 3A and 3B depict different embodiments of integrated memory assemblies.

FIG. 3A depicts a side view of an embodiment of an integrated memory assembly 300 stacked on a substrate 302 (e.g., a stack including control die 304 and memory die 306). In this embodiment, the integrated memory assembly 300 has three control die 304 and three memory die 306. In some embodiments, there are more than three memory die 306 and more than three control die 304.

Each control die 304 is affixed (e.g., bonded) to at least one memory die 306. Some of the bond pads 308/310 are depicted, although there may be many more bond pads. A space between two die 306, 304 that are bonded together is filled with a solid layer 312, which may be formed from epoxy or other resin or polymer. This solid layer 312 protects the electrical connections between the die 306, 304 and further secures the die together. Various materials may be used as solid layer 312, but in some embodiments, it may be Hysol epoxy resin from Henkel Corp., having offices in California, USA.

Integrated memory assembly 300 may for example be stacked with a stepped offset, leaving the bond pads at each level uncovered and accessible from above. Wire bonds 314 connected to the bond pads connect control die 304 to substrate 302. A number of such wire bonds may be formed across the width of each control die 304 (i.e., into the page of FIG. 3A).

A memory die through silicon via (TSV) 316 may be used to route signals through each memory die 306. A control die TSV 318 may be used to route signals through each control die 304. The TSVs 316, 318 may be formed before, during or after formation of the integrated circuits in semiconductor die 306, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, Solder balls 320 optionally may be affixed to contact pads 322 on a lower surface of substrate 302. Solder balls 320 may be used to couple integrated memory assembly 300 electrically and mechanically to a host device such as a printed circuit board. Solder balls 320 may be omitted where the integrated memory assembly 300 is to be used as an LGA package. Solder balls 320 may form a part of an interface between integrated memory assembly 300 and memory controller 104 (FIG. 1).

Figure 3B:
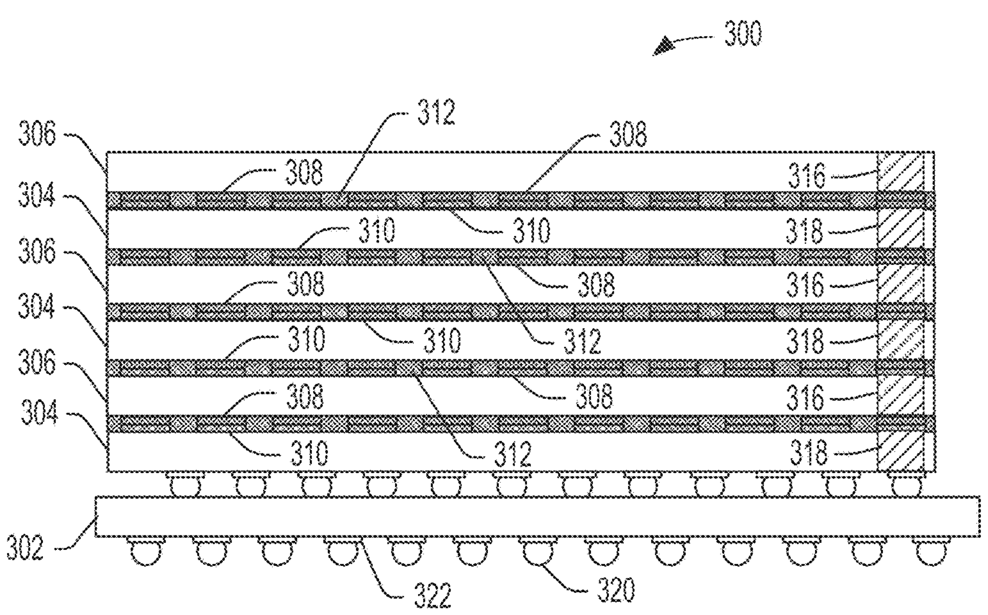

FIG. 3B depicts a side view of another embodiment of an integrated memory assembly 300 stacked on a substrate 302. The integrated memory assembly 300 of FIG. 3B has three control die 304 and three memory die 306. In some embodiments, there are many more than three memory die 306 and many more than three control die 304. In this example, each control die 304 is bonded to at least one memory die 306. Optionally, a control die 304 may be bonded to two or more memory die 306.

Some of the bond pads 308, 310 are depicted, but there may be many more bond pads than are illustrated. A space between two die 306, 304 that are bonded together is filled with a solid layer 312, which may be formed from epoxy or other resin or polymer. In contrast to the example in FIG. 3A, the integrated memory assembly 300 of FIG. 3B does not have a stepped offset. A memory die TSV 316 may be used to route signals through each memory die 306. A control die TSV 318 may be used to route signals through each control die 304.

As has been briefly discussed above, control die 304 and memory die 306 may be bonded together. Bond pads on each control die 304 and each memory die 306 may be used to bond the two die together. In some embodiments, the bond pads are bonded directly to each other, without solder or other added material, in a so-called Cu-to-Cu bonding process.

In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension.

As has been briefly discussed above, the control die 304 and the memory die 306 may be bonded together. Bond pads on each control die 304 and each memory die 306 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat also may be applied. In embodiments using cu-to-cu bonding, the bond pads may be about 5 μm square and spaced from each other with a pitch of 5 μm to 5 μm. Although this process is referred to herein as cu-to-cu bonding, this term also may apply even where the bond pads are formed of materials other than copper. When the area of bond pads is small, it may be difficult to bond the semiconductor die together. The size of and pitch between bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on a surface of the control die 304 and the memory die 306. Where no such film is initially provided, a space between the die may be under filled with an epoxy or other resin or polymer. The under-fill material may be applied as a liquid which then hardens into a solid layer. This under-fill step protects the electrical connections between control die 304 and memory die 306, and further secures the die together. Various materials may be used as under-fill material, such as Hysol epoxy resin from Henkel Corp., having offices in California, U.S.A.

Figure 4A:
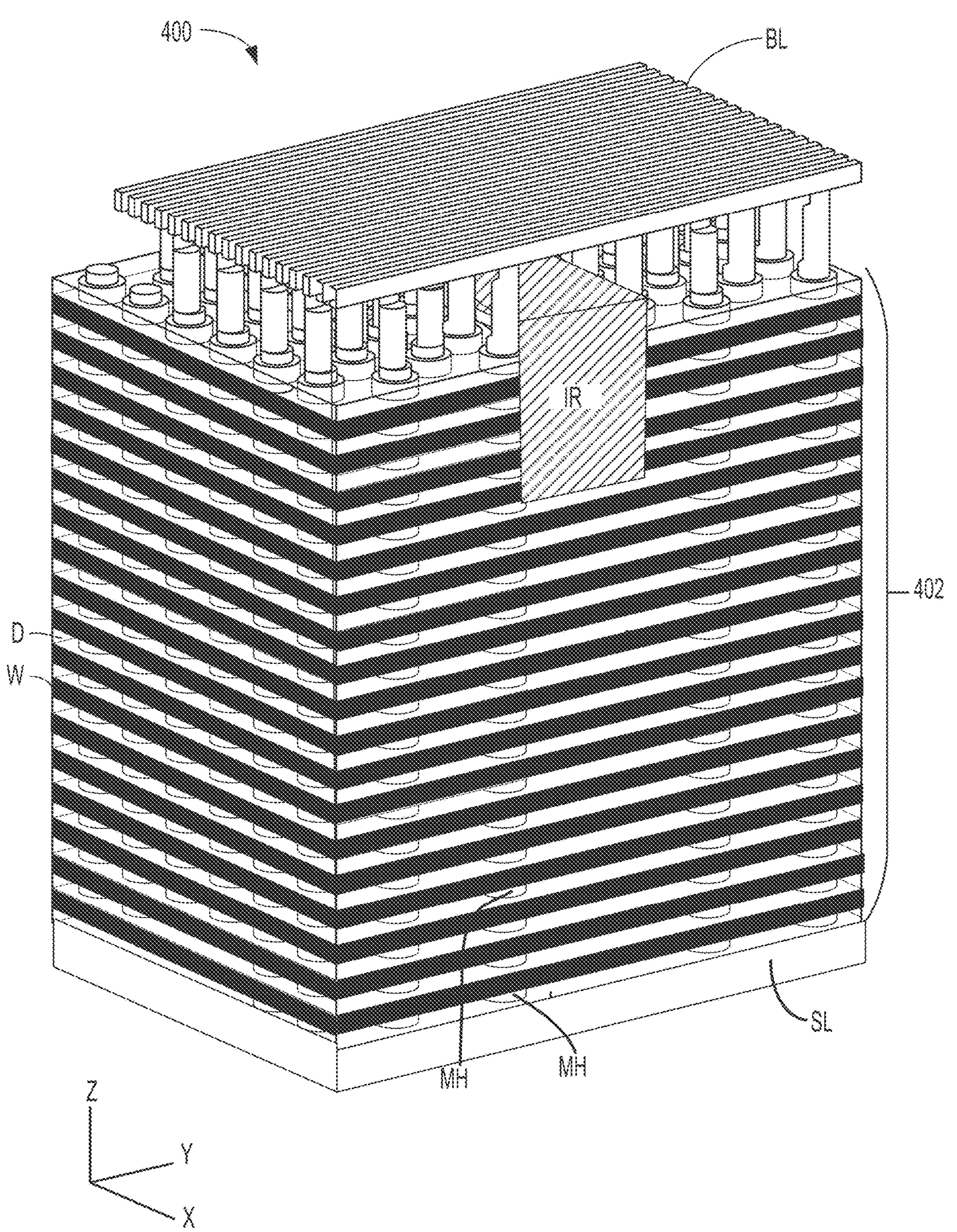
FIG. 4A is a perspective view of a portion of one embodiment of a monolithic three dimensional memory structure.

FIG. 4A is a perspective view of a portion of one example embodiment of a monolithic three dimensional memory array/structure included in memory structure 202, which includes a plurality non-volatile memory cells arranged as vertical NAND strings. For example, FIG. 4A shows a portion 400 of one block of memory. The structure depicted includes a set of bit lines BL positioned above a stack 402 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements.

As will be explained below, in one embodiment the alternating dielectric layers and conductive layers are divided into, for example, four or five (or a different number of) regions by isolation regions IR. FIG. 4A shows one isolation region IR separating two regions. Below the alternating dielectric layers and word line layers is a common source line layer SL. Memory holes are formed in the stack of alternating dielectric layers and conductive layers. For example, one of the memory holes is marked as MH. Note that in FIG. 4A, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells.

The non-volatile memory cells are arranged in memory holes, and each memory cell can store one or more bits of data, e.g., up to five bits of data per memory cell. More details of the three dimensional monolithic memory array that comprises memory structure 202 is provided below.

Figure 4B:
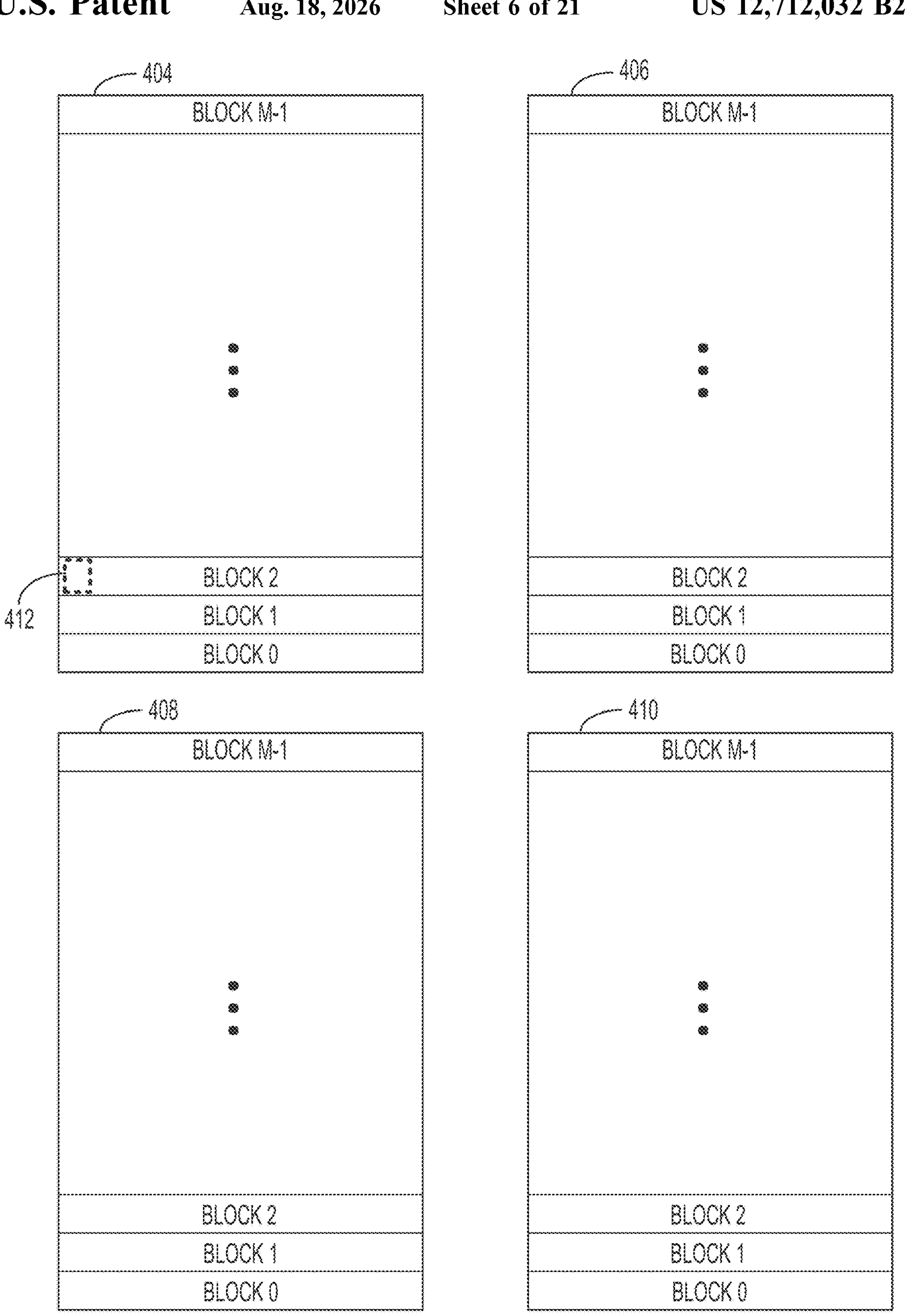
FIG. 4B is a block diagram of one embodiment of a memory structure having four planes.

FIG. 4B is a block diagram explaining one example organization of memory structure 202, which is divided into four planes 404, 406, 408 and 410. Each plane is then divided into M blocks. In one example, each plane has about 2,000 blocks ("Block 0" to "Block M-1" with M being 2,000). However, different numbers of blocks and planes can also be used.

In one embodiment, a block of memory cells is a unit of erase. That is, all memory cells of a block are erased together. In other embodiments, the blocks can be divided into sub-blocks, each of which includes a plurality of word lines, and the sub-blocks can be the unit of erase. Memory cells also can be grouped into blocks for other reasons, such as to organize the memory structure to enable the signaling and selection circuits.

In some embodiments, a block represents groups of connected memory cells as the memory cells of a block share a common set of word lines. For example, the word lines for a block are all connected to all of the vertical NAND strings for that respective block. Although FIG. 4B shows four planes, each of which includes a plurality of blocks, more or fewer than four planes can be implemented in the memory structure 202. In some embodiments, the memory structure includes eight planes.

Each block typically is divided into one or more pages, with each page being a unit of programming/writing and a unit of reading. Other units of programming also can be used. In an embodiment, one or more pages of data are typically stored in one row of memory cells. For example, one or more pages of data may be stored in memory cells connected to a common word line. In an embodiment, a page includes data stored in all memory cells connected to a common word line within the block.

Figure 4C:
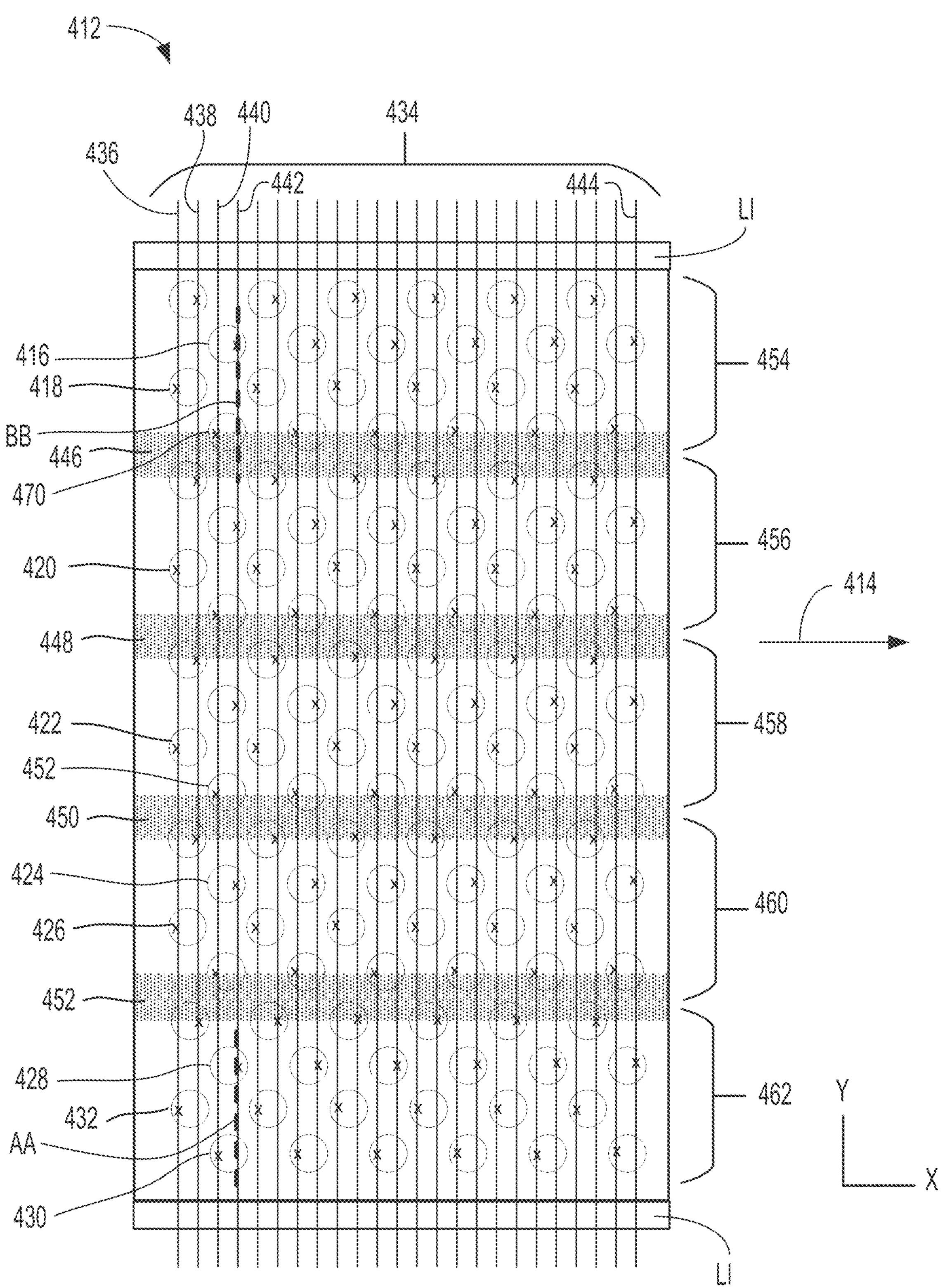
FIG. 4C depicts a top view of a portion of one embodiment of a block of memory cells.

FIGS. 4C-4G depict an example three dimensional ("3D") NAND structure that corresponds to the structure of FIG. 4A and can be used to implement the memory structure 202 of FIGS. 2A and 2B. FIG. 4C is a block diagram that depicts a top view of a portion 412 of Block 2 of plane 404. As can be seen from FIG. 4C, the block depicted in FIG. 4C extends in the direction of 414. In one embodiment, the memory array has many such layers with only the top layer being illustrated in FIG. 4C.

FIG. 4C depicts a plurality of circles that represent the memory holes, which are also referred to as vertical columns. Each of the memory holes/vertical columns includes multiple select transistors (also referred to as a select gate or selection gate) and multiple memory cells. In one embodiment, each memory hole/vertical column implements a NAND string. For example, FIG. 4C labels a subset of the memory holes/vertical columns/NAND strings 416, 418, 420, 422, 424, 426, 428, 430, and 432.

FIG. 4C also depicts a set of bit lines 434, including bit lines 436, 438, 440, 442, . . . 444. FIG. 4C shows twenty four bit lines because only a portion of the block is depicted. It is contemplated that more than twenty four bit lines connected to memory holes/vertical columns of the block. Each of the circles representing memory holes/vertical columns has an "x" to indicate its connection to one of the bit lines. For example, bit line 436 is connected to the memory holes/vertical columns 418, 420, 422, 426, and 432. The bit lines 436, 438, 440, 442 also are in electrical communication with all other blocks in a given plane.

The block depicted in FIG. 4C includes a set of isolation regions 446, 448, 450 and 452, which are formed of $SiO_2$. However, other dielectric materials also can be used. Isolation regions 446, 448, 450, and 452 serve to divide the top layers of the block into five regions. For example, the top layer depicted in FIG. 4C is divided into regions 454, 456, 458, 460, and 462.

In one embodiment, the isolation regions only divide the layers used to implement select gates so that NAND strings in different regions can be independently selected. In one example implementation, a bit line connects to one memory hole/vertical column/NAND string in each of regions 454, 456, 458, 460, and 462. In that implementation, each block has twenty-four rows of active columns and each bit line connects to five rows in each block.

In one embodiment, all of the five memory holes/vertical columns/NAND strings connected to a common bit line are connected to the same set of word lines; therefore, the system uses the drain side selection lines to choose one (or another subset) of the five to be subjected to a memory operation (program, verify, read, and/or erase).

FIG. 4C also shows Line Interconnects LI, which are metal connections to the source line SL from above the memory array. Line Interconnects LI are positioned adjacent regions 454 and 462.

Although FIG. 4C shows each region 454, 456, 458, 460, and 462 as having four rows of memory holes/vertical columns, five regions and twenty four rows of memory holes/vertical columns in a block, those exact numbers are an example implementation. Other embodiments may include more or fewer regions per block; more or fewer rows of memory holes/vertical columns per region; and more or fewer rows of vertical columns per block.

FIG. 4C also shows the memory holes/vertical columns being staggered. In other embodiments, different patterns of staggering can be used. In some embodiments, the memory holes/vertical columns are not staggered.

Figure 4D:
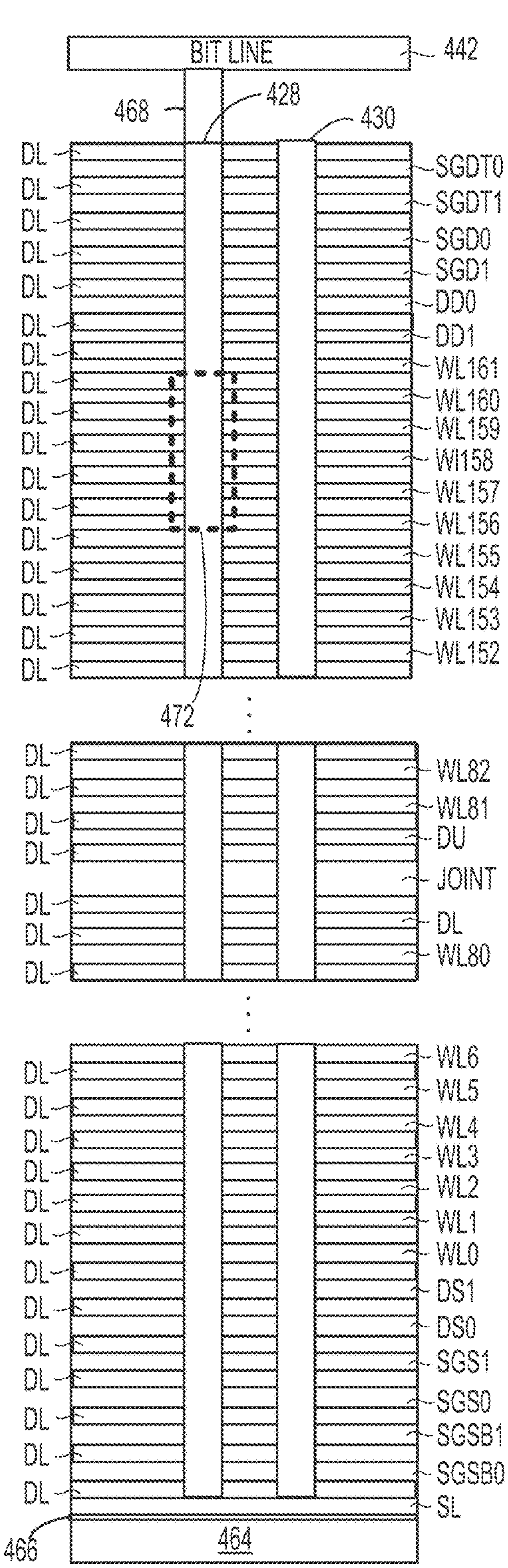
FIG. 4D depicts a cross sectional view of a portion of one embodiment of a block of memory cells.
Figure 4D:
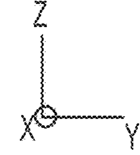

FIG. 4D depicts a portion of one embodiment of a three dimensional memory structure 202 showing a cross-sectional view along line AA of FIG. 4C. This cross sectional view cuts through memory holes/vertical columns (NAND strings) 428 and 430 of region 462 (see FIG. 4C).

The structure of FIG. 4D includes two drain side select layers SGD0 and SGD1; two source side select layers SGS0 and SGS1; two drain side GIDL generation transistor layers SGDT0 and SGDT1; two source side GIDL generation transistor layers SGSB0 and SGSB1; two drain side dummy word line layers DD0 and DD1; two source side dummy word line layers DS0 and DS1; dummy word line layers DU and DL that are separated by a joint; one hundred and sixty two word line layers WL0-WL161 for connecting to data memory cells; and dielectric layers DL. Other embodiments can implement more or fewer than the numbers described above for FIG. 4D. In one embodiment, SGD0 and SGD1 are connected together and SGS0 and SGS1 are connected together. In other embodiments, more or fewer SGDs (greater or lesser than two) are connected together and more or fewer SGS devices (greater or lesser than two) are connected together.

In one embodiment, erasing the memory cells is performed using gate induced drain leakage (GIDL), which includes generating charge carriers at the GIDL generation transistors such that the carriers get injected into the charge trapping layers of the NAND strings to change (reduce) respective threshold voltages Vt of the memory cells. In the embodiment of FIG. 4D, there are two GIDL generation transistors at each end of the NAND string; however, in other embodiments there are more or fewer than two GIDL generation transistors.

Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

The GIDL generation transistors have an abrupt PN junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

The memory holes/vertical columns 428, 430 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 464, an insulating film 466 on the substrate, and source line SL. The NAND string of memory hole/vertical column 428 has a source end at a bottom of the stack and a drain end at a top of the stack. As in agreement with FIG. 4C, FIG. 4D show vertical memory hole/column 428 connected to bit line 442 via connector 468.

For ease of reference, drain side select layers, source side select layers, dummy word line layers, GIDL generation transistor layers and data word line layers collectively are referred to as conductive layers.

In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof.

In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-W161 connect to memory cells (also called data memory cells). The dummy word line layers connect to a plurality of dummy memory cells, which do not store data. In some embodiments, the data memory cells and the dummy memory cells may have a same structure. The drain side select layers SGD0 and SGD1 are used to electrically connect and disconnect the NAND strings to and from the bit lines. The source side select layers SGS0 and SGS1 are used to electrically connect and disconnect the NAND strings to and from the source line SL.

FIG. 4D shows that the memory array is implemented as a two tier architecture, with the tiers separated by a joint area. In one embodiment, it is expensive and/or challenging to etch so many word line layers intermixed with dielectric layers. To ease this burden, a first stack of word line layers (e.g., WL0-WL80) are laid down with alternating dielectric layers, then the Joint area is laid down, and next, a second stack of word line layers (e.g., WL81-WL161) are laid down with alternating dielectric layers. The joint area is thus positioned between the first stack of word line layers and the second stack of word line layers. In one embodiment, the joint areas are made from the same materials as the word line layers. In other embodiments, there can no joint area or there can be multiple joint areas.

Figure 4E:
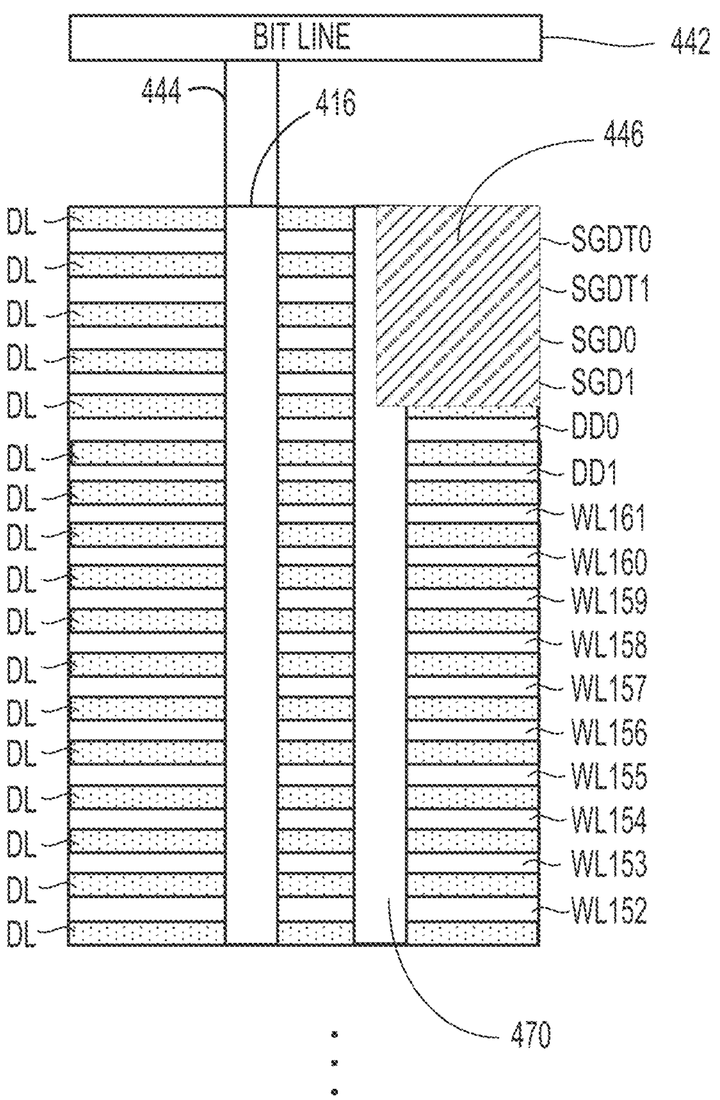
FIG. 4E depicts a cross sectional view of a portion of one embodiment of a block of memory cells.

FIG. 4E depicts a portion of one embodiment of a three dimensional memory structure 202 showing a cross-sectional view along line BB of FIG. 4C. This cross sectional view cuts through memory holes/vertical columns (NAND strings) 416 and 470 of region 454 (see FIG. 4C). FIG. 4E shows the same alternating conductive and dielectric layers as FIG. 4D.

FIG. 4E also shows isolation region 446, which occupies a space that would have been used for a portion of the memory holes/vertical columns/NAND stings, including a space that would have been used for a portion of memory hole/vertical column 470. More specifically, a portion (e.g., half the diameter) of vertical column 470 has been removed in layers SGDT0, SGDT1, SGD0, and SGD1 to accommodate isolation region 446. Thus, while most of the vertical column 470 is cylindrical (has a circular cross section), the portion of vertical column 470 in layers SGDT0, SGDT1, SGD0, and SGD1 has a semi-circular cross section. In one embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 454, 456, 458, 460, and 462 (illustrated in FIG. 4C).

Figure 4F:
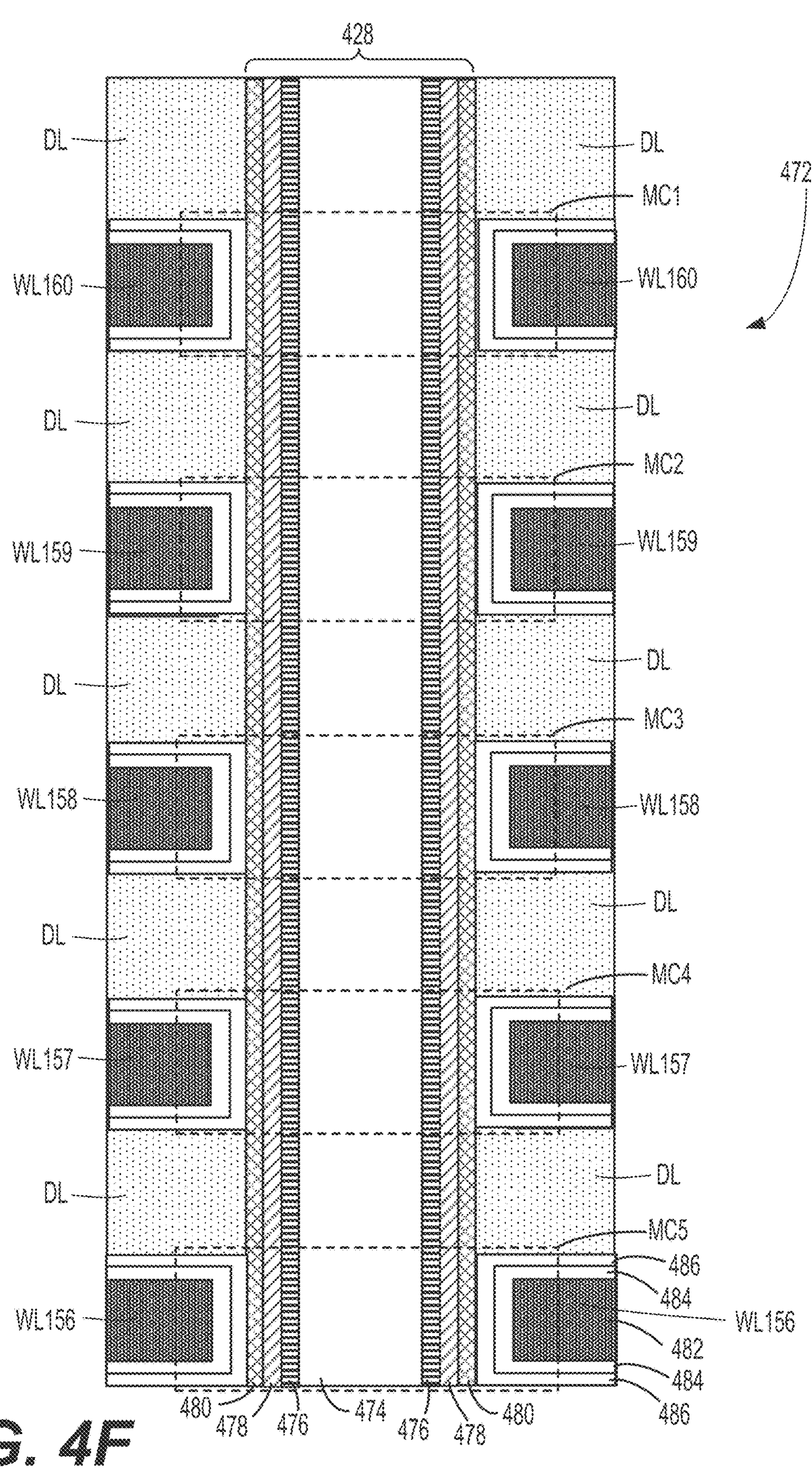
FIG. 4F is a cross sectional view of one embodiment of a vertical column of memory cells.

FIG. 4F depicts a cross sectional view of region 472 of FIG. 4D that includes a portion of memory hole/vertical column 428. In one embodiment, the memory holes/vertical columns are round. However, in other embodiments other shapes can be used. In one embodiment, memory hole/vertical column 428 includes an inner core layer 474 that is made of a dielectric, such as $SiO_2$. Surrounding the inner core 474 is a polysilicon channel 476 (materials other than polysilicon can alternately be used). The channel 476 extends between and is connected with the bit line and the source line. Surrounding the channel 476 is a tunneling dielectric 478 layer, which may have an ONO structure. Surrounding the tunneling dielectric 478 layer is charge trapping layer 480, which may be formed of, for example, Silicon Nitride. It should be appreciated that the technology described herein is not limited to any particular material or structure.

FIG. 4F depicts the dielectric layers DL as well as the word line layers WL160, WL159, WL158, WL157, and WL156. Each of these word line layers includes a word line region 482 surrounded by an aluminum oxide layer 484, which is surrounded by a blocking oxide layer 486. In other embodiments, the blocking oxide layer 486 can be a vertical layer that is parallel with and adjacent to the charge trapping layer 480. The physical interaction of the word line layers with the vertical column forms the memory cells of the NAND string. Thus, in one embodiment a memory cell includes the channel 476, the tunneling dielectric 478, the charge trapping layer 480, the blocking oxide layer 486, the aluminum oxide layer 484, and the word line region 482. For example, word line layer WL160 and a portion of memory hole/vertical column 428 comprise a memory cell MC1. Word line layer WL159 and a portion of memory hole/vertical column 428 comprise a memory cell MC2. Word line layer WL158 and a portion of memory hole/vertical column 428 comprise a memory cell MC3. Word line layer WL157 and a portion of memory hole/vertical column 428 comprise a memory cell MC4. Word line layer WL156 and a portion of memory hole/vertical column 428 comprise a memory cell MC5. In other architectures, a memory cell may have a different structure; however, the memory cell would still be the storage unit.

When a memory cell is programmed, electrons are stored in a portion of the charge trapping layer 480 which is associated with (e.g., in) the memory cell. These electrons are drawn into the charge trapping layer 480 from the channel 476, through the tunneling dielectric 478, in response to an appropriate voltage on word line region 482. The threshold voltage (Vth) of a memory cell is increased in proportion to the amount of stored charge.

In one embodiment, the programming is achieved through Fowler-Nordheim tunneling of the electrons into the charge trapping layer 480. During an erase operation, the electrons return to the channel 476 or holes are injected into the charge trapping layer 480 to recombine with electrons. In one embodiment, erasing is achieved using hole injection into the charge trapping layer 480 via a physical mechanism such as GIDL, as described above.

Figure 4G:
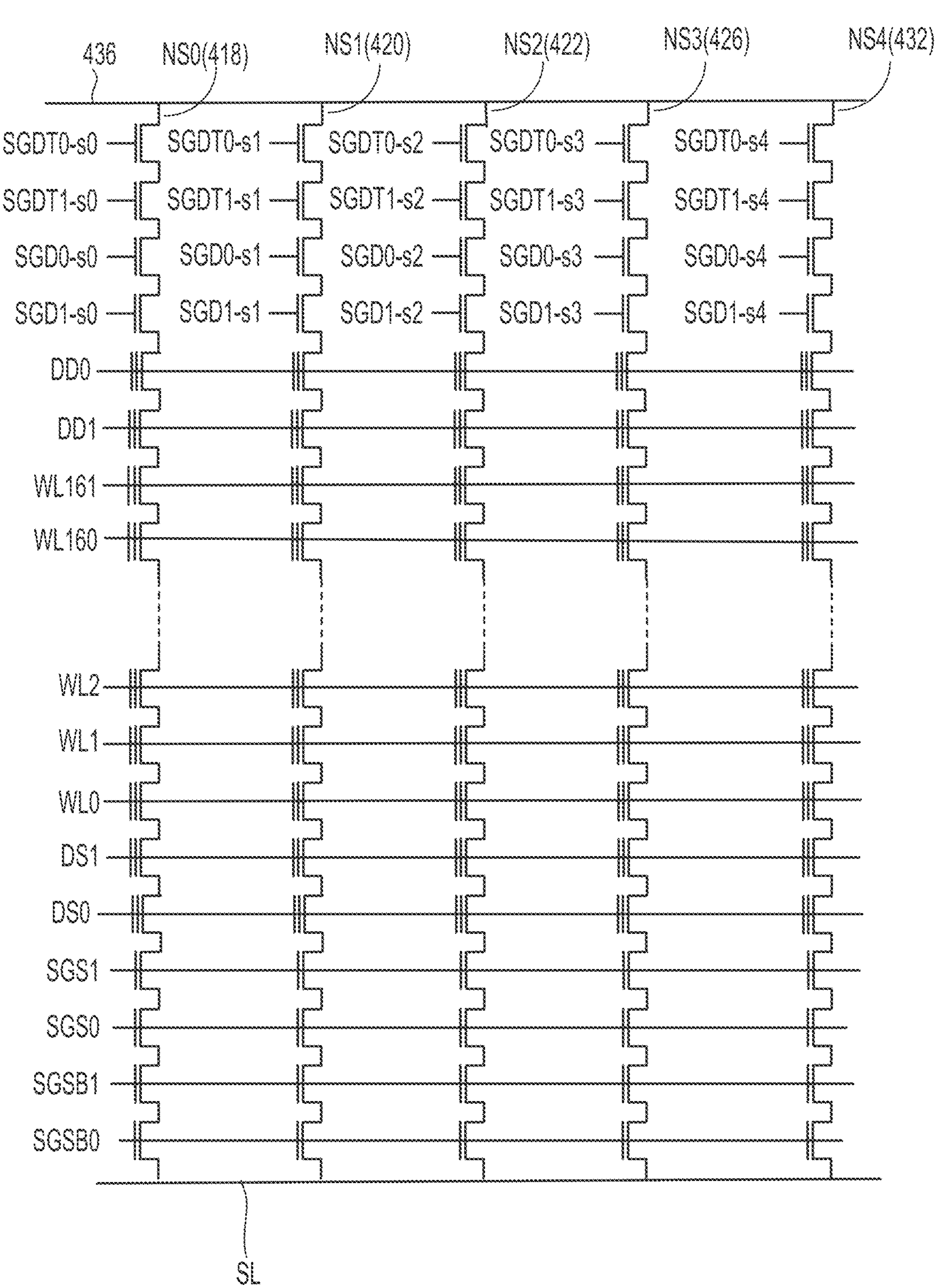
FIG. 4G is a schematic of a plurality of NAND strings in multiple regions of a same block.

FIG. 4G is a schematic diagram of a portion of the three dimensional memory array depicted in in FIGS. 4B-4F. FIG. 4G shows physical data word lines WL0-WL161 running across the entire block. The structure of FIG. 4G corresponds to a portion 412 in Block 2 of FIG. 4B, including bit line 436. Within the block, in one embodiment, each bit line is connected to five NAND strings, one in each region of regions 454, 456, 458, 460, 462 (illustrated in FIG. 4C).

In one embodiment, the programming is achieved through Fowler-Nordheim tunneling of the electrons into the charge trapping layer 480. During an erase operation, the electrons return to the channel 476 or holes are injected into the charge trapping layer 480 to recombine with electrons. In one embodiment, erasing is achieved using hole injection into the charge trapping layer 480 via a physical mechanism such as GIDL, as described above.

FIG. 4G is a schematic diagram of a portion of the three dimensional memory array depicted in in FIGS. 4B-4F. FIG. 4G shows physical data word lines WL0-WL161 running across the entire block. The structure of FIG. 4G corresponds to a portion 412 in Block 2 of FIG. 4B, including bit line 436. Within the block, in one embodiment, each bit line is connected to five NAND strings, one in each region of regions 454, 456, 458, 460, 462 (illustrated in FIG. 4C).

Similarly, the drain side select line/layer SGD1 is separated by isolation regions 446, 448, 450, and 452 (illustrated in FIG. 4C) to form SGD1-*s*0, SGD1-*s*1, SGD1-*s*2, SGD1-*s*3 and SGD1-*s*4 in order to separately connect to and independently control regions 454, 456, 458, 460, 462 (illustrated in FIG. 4C). The drain side GIDL generation transistor control line/layer SGDT0 is also separated by isolation regions 446, 448, 450 and 452 to form SGDT0-*s*0, SGDT0-*s*1, SGDT0-*s*2, SGDT0-*s*3 and SGDT0-*s*4 in order to separately connect to and independently control regions 454, 456, 458, 460, 462. Further, the drain side GIDL generation transistor control line/layer SGDT1 is separated by isolation regions 446, 448, 450 and 452 to form SGDT1-*s*0, SGDT1-*s*1, SGDT1-*s*2, SGDT1-*s*3 and SGDT1-*s*4 in order to separately connect to and independently control regions 454, 456, 458, 460, 462.

FIG. 4G only shows NAND strings connected to bit line 436. However, a full schematic of the block would show every bit line and five vertical NAND strings, which are in separate regions, connected to each bit line.

Although the example memories of FIGS. 4B-4G are three dimensional memory structures that include vertical NAND strings with charge-trapping material, other (2D and 3D) memory structures can also be used with the technology described herein.

The present disclosure is related to operating techniques that increase the bandwidth of a non-volatile memory device for the purpose of producing a high bandwidth flash (HBF) memory device that may be used as a replacement for HBM, particularly for machine learning inferencing operations. The HBF memory devices of the present disclosure are configured to be operated according to a 1 bit per memory cell (sometimes referred to as "single level cell" or "SLC" memory) storage scheme. The SLC storage scheme (as opposed to other storage schemes that allow multiple bits to be stored in each memory cell), is chosen because it is the fastest solution for reducing read latency (and increasing bandwidth).

Figure 10:
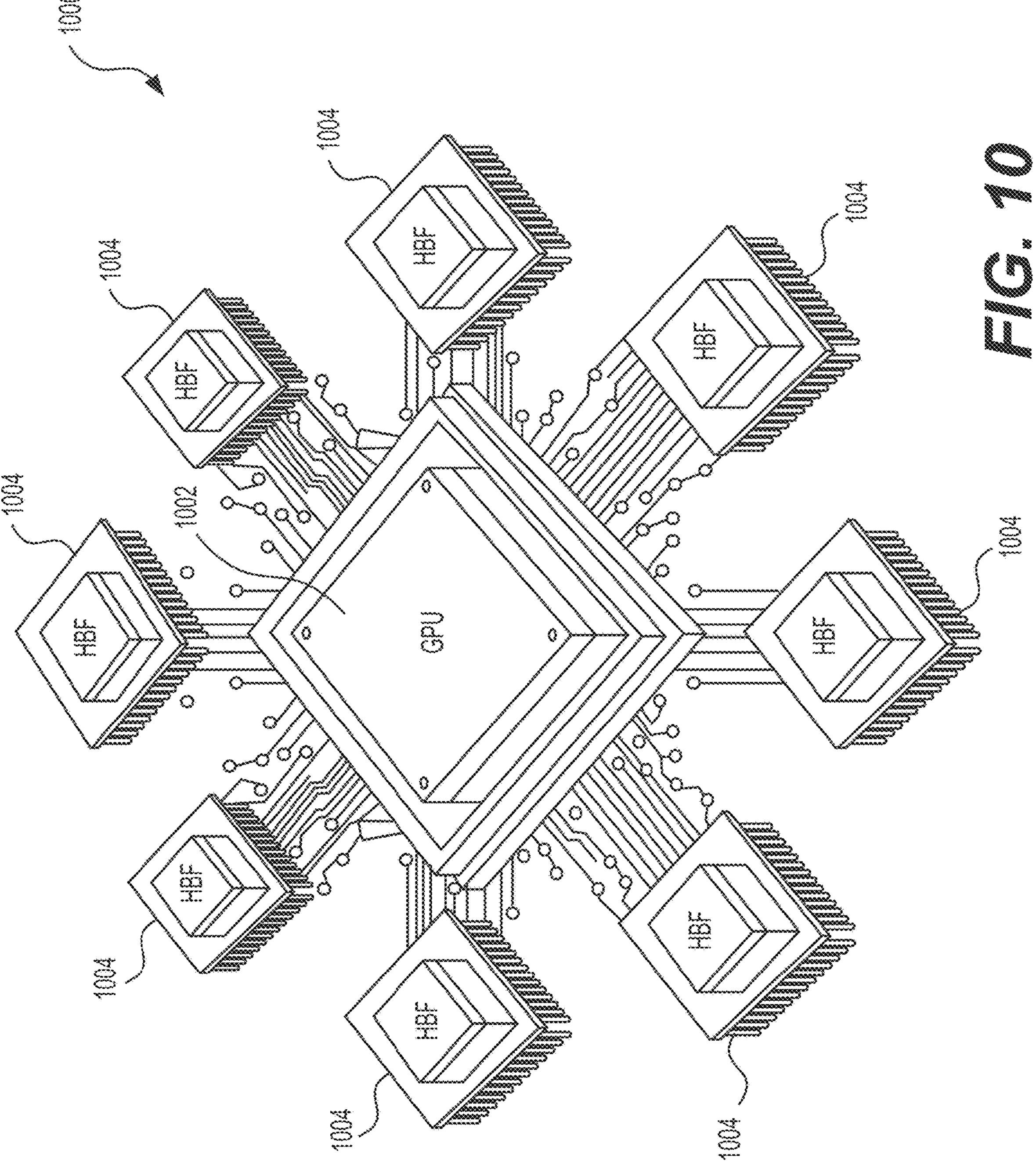
FIG. 10 is a schematic view depicting an example computing system that includes a single processing unit and a plurality of high bandwidth flash (HBF) units.

FIG. 10 illustrates an example embodiment of a computing system 1000 constructed according to aspects of the present disclosure. The computing system 1000 includes a single graphics processor unit (GPU) 1002 (or a similar processor unit) and eight HBF packages 1004, which are all in electrical communication with the single GPU 1002. Such a computing system 1000 may be particularly adapted for use in storing data pertaining to a large language mode because once the model data have been stored in the HBF packages 1004, the model data are not updated or changed very often. Thus, for a machine learning inferencing application, the HBF packages 1004 can be considered write once, read many times memory. In some embodiments, the computing system 1000 can include more or fewer than eight HBF packages 1004. For example, in another embodiment, the computing system includes five HBF packages that are in electrical communication with a single GPU.

In an exemplary embodiment, each of the HBF packages 1004 includes eight memory dies, each of which includes thirty-two planes that can be independently and simultaneously be operated on. In some embodiments, the number of dies in each HBF packages and the number of planes per die can vary from these figures.

As discussed in further detail below, an aspect of the present disclosure is related to a method of operating the computing system 1000 that includes transmitting data between the single GBU 1002 and the HBF packages 1004 at rates of greater than 2.7 TB/s and preferably greater than 3 TB/s.

As described above, in some machine learning applications, large language models that include a terabyte (or more) of data that must be stored in memory and retrieved at a very high data rate. Such applications, which require very high bandwidth and low power, typically store data in HBM DRAM. For example, in an existing machine learning system application, a processor (e.g., a CPU, GPU or other processor) is coupled to six (6) HBM DRAM devices and has a system bandwidth of 3 TB/s. However, DRAM is very expensive and each DRAM device has limited capacity. Thus, the number of HBM chips needed to store an entire large language model is very costly.

Non-volatile memory (e.g., NAND) is significantly less expensive than DRAM, but the bandwidth of conventional NAND memory devices is much lower than that of HBM DRAM. For example, an HBM DRAM die has a bandwidth of about 75 GB/sec. In contrast, a conventional NAND memory die has a bandwidth of about 4.4 GB/sec.

Achieving a bandwidth of greater than 2.7 TB/s (preferably at least 3 TB/s) using conventional NAND memory devices would require a prohibitively large number of memory packages. For example, with 16 memory die per memory package, each memory package has a bandwidth of 16×4.4 GB/s=70.4 GB/s. To provide a bandwidth of 3 TB/sec, forty-four (44) memory packages would be required, which is not practical.

In addition, the power consumption of conventional NAND memory devices is too high to provide a viable alternative to HBM devices. For example, in conventional NAND technology, the memory array itself has a power efficiency of approximately 4.5 pJ/bit, e.g., greater than 4.1 pJ/bit. However, in the exemplary embodiment, the HBF packages 1004 have a power efficiency of no greater than approximately 1 pJ/bit, i.e., less than 1.1 pJ/bit.

The present disclosure is related generally to technology that increases the bandwidth of and reduces the power consumption of non-volatile memory, such as flash memory. In particular, the aforementioned HBF packages utilize this technology to provide the HBF packages with sufficient bandwidth and acceptable power efficiency for use in large language model processing.

In embodiments, the bandwidth of HBF memory is increased by: (1) increasing the number of memory planes per memory die, (2) increasing the number of input/output (I/O) channels per memory die to accommodate the increased bandwidth of the memory die, and (3) reducing the physical page size to decrease read latency. These are discussed below.

Figure 5A:
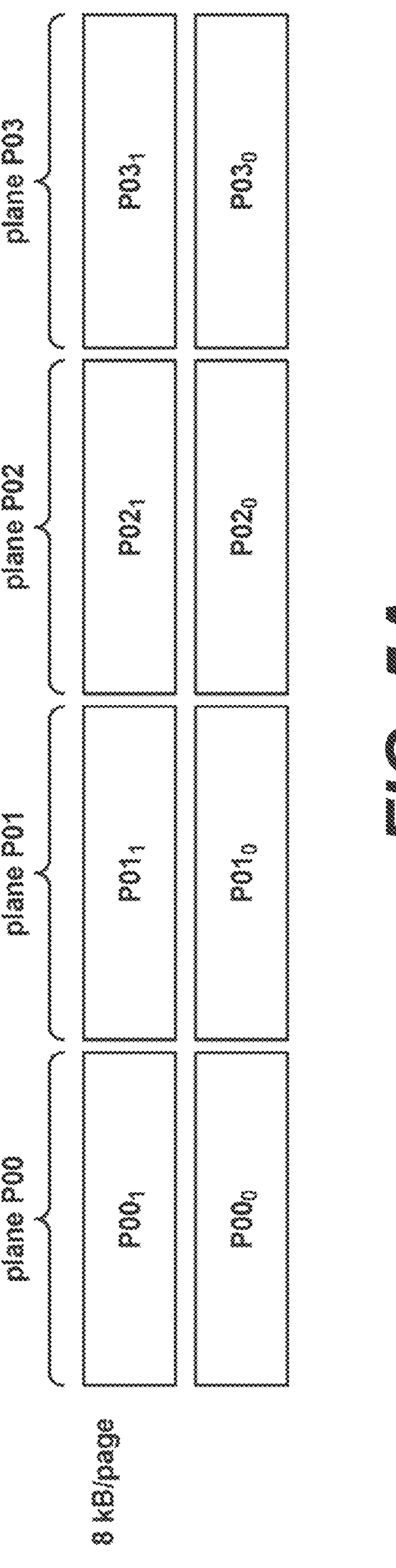
FIG. 5A is a block diagram of one embodiment of a memory structure having four planes.

As described above, a memory structure (such as memory structure 202 of FIG. 2A) may include multiple planes, and each plane may operate in parallel. For example, FIG. 5A is a diagram depicting a memory structure that includes four planes: P00, P01, P02 and P03.

In an embodiment, each of planes P00, P01, P02 and P03 is divided into two sub-planes. For example, plane P00 includes a first sub-plane $P\mathbf{00}_0$ and a second sub-plane $P\mathbf{00}_1$, second sub-plane P01 includes a first sub-plane $P\mathbf{01}_0$ and a second sub-plane $P\mathbf{01}_1$, third sub-plane P02 includes a first sub-plane $P\mathbf{02}_0$ and a second sub-plane $P\mathbf{02}_1$, and fourth sub-plane P03 includes a first sub-plane $P\mathbf{03}_0$ and a second sub-plane $P\mathbf{03}_1$.

In an embodiment, each of planes P00, P01, P02 and P03 includes a logical page and a physical page size. In the embodiment of FIG. 5A, the physical page size is 8 kB/page, and each logical page includes two physical pages (i.e., 16 kB per logical page).

In an embodiment, a memory die that includes planes P00, P01, P02 and P03 has a capacity of 32 GB. In an embodiment, sixteen (16) memory die are included in a memory package, and the memory package has a capacity of 16×32 GB=512 GB. Other capacities per memory die, and other numbers of memory die per memory package may be used.

In an embodiment, a memory die that includes planes P00, P01, P02 and P03 has a read latency ("tR") of approximately 15 μsec. The per-die bandwidth can be determined from read latency and the logical page size as follows:

$$BW = \frac{\left(16kB \times \frac{1024B}{kB}\right)}{15 \times 10^{-6}\ \text{sec}} \times 4\ \text{planes} = 4.4\ GB/s$$

In an embodiment, a memory die that includes planes P00, P01, P02 and P03 has an 8 bit I/O, and has an I/O speed of 4.8 G-transfers/s. Because the I/O speed (4.8 G-transfers/s) is faster that the memory die data rate (4.4 GB/sec), the I/O speed is not a factor limiting the data rate of the memory die.

In an embodiment, the number of planes per memory die is increased to increase the memory die bandwidth. For example, FIG. 5B is a diagram depicting a memory structure that includes thirty-two (32) planes: four planes in the x-direction (e.g., planes P00, P01, P02 and P03) and eight planes in the y-direction (e.g., planes P03, P13, P23, P33, P43, P53, P63 and P73).

In an embodiment, each of planes P00, P01, P02, . . . , P72 and P73 is divided into two sub-planes. For example, plane P00 includes a first sub-plane $\mathbf{P00}_0$ and a second sub-plane $\mathbf{P00}_1$, a second sub-plane P01 includes a first sub-plane $\mathbf{P01}_0$ and a second sub-plane $\mathbf{P01}_1$, . . . , and a thirty-secondth sub-plane P73 includes a first sub-plane $\mathbf{P73}_0$ and a second sub-plane $\mathbf{P73}_1$.

In an embodiment, each of planes P00, P01, P02, . . . , P72 and P73 includes a logical page and a physical page size. In the embodiment of FIG. 5B, the physical page size is 8 kB/page, and each logical page includes two physical pages (i.e., 16 kB per logical page).

The structure of FIG. 5B can be derived from the structure of FIG. 5A by keeping the same number of planes in the x-direction (4 planes in x-direction), splitting the planes in half in the y-direction, and repeating four copies (for a total of 8 planes in y-direction), for a total of 4×8=32 planes per memory die. This is eight (8) times the number of planes of FIG. 5A embodiment. Thus, the total capacity of each die is 0.5×8×32 GB=128 GB and the bandwidth of each die is 8×4.4 GB/s=35.2 GB/s.

In an embodiment, sixteen (16) memory die are included in a memory package (e.g., each HBF packages 1004 illustrated in FIG. 10), and thus the memory package has a capacity of 16×128 GB=2 TB. Each memory package has a bandwidth of 16×35.2 GB/s=563.2 GB/s. To provide a bandwidth of greater than 2.7 TB/s (preferably, approximately 3 TB/sec), five (5) memory packages would be required. Eight HBF packages 1004 are depicted in the exemplary embodiment of FIG. 10.

To provide this bandwidth, the number of I/O channels per die must be increased. As described above, an 8 bit I/O has a speed of 4.8 G-transfers/s. If the number of I/O are increased by a factor of 8 to 64 I/O, the I/O speed increases to 8×4.8 G-transfers/s=38.4 G-transfers/s, which is faster that the memory die data rate (35.2 GB/sec).

In additional embodiments, the memory die bandwidth can be increased by reducing the physical page size to reduce read latency tR. For example, FIG. 5C is a diagram depicting a memory structure that includes thirty-two (32) planes: eight (8) planes in the x-direction (e.g., planes P00, P01, . . . , and P07) and four (4) planes in the y-direction (e.g., planes P07, P17, P27 and P37).

In an embodiment, each of planes P00, P01, P02, . . . , P36 and P37 is divided into two sub-planes. For example, plane P00 includes a first sub-plane $\mathbf{P00}_0$ and a second sub-plane $\mathbf{P00}_1$, a second sub-plane P01 includes a first sub-plane $\mathbf{P01}_0$ and a second sub-plane $\mathbf{P01}_1$, . . . , and a thirty-secondth sub-plane P37 includes a first sub-plane $\mathbf{P37}_0$ and a second sub-plane $\mathbf{P37}_1$.

In an embodiment, each of planes P00, P01, P02, . . . , P36 and P37 includes a logical page and a physical page size. In the embodiment of FIG. 5C, the physical page size is 4 kB/page, and each logical page includes two physical pages (i.e., 8 kB per logical page).

The structure of FIG. 5C can be derived from the structure of FIG. 5B by dividing each 8 kB plane into two (2) 4 kB planes in the x-direction (eight planes in x-direction), and reducing the number of planes by half in the y-direction (four planes in y-direction), for a total of thirty-two (32) planes. This is the same number of planes as the FIG. 5B embodiment. The total capacity of each die is 64 GB.

By cutting each word line in half (from 8 kB to 4 KB), the read latency tR decreases. In an embodiment, the read latency tR of the embodiment of FIG. 5C is 4 μsec (compared with a read latency tR of 15 μsec for the FIG. 5B embodiment). The per-die bandwidth can be determined from read latency and the logical page size as follows:

$$BW = \frac{\left(8kB \times \frac{1024B}{kB}\right)}{4 \times 10^{-6}\ \text{sec}} \times 32\ \text{planes} = 66\ GB/s$$

In an embodiment, sixteen (16) memory die are included in a memory package (e.g., the HBF packages 1004 depicted in FIG. 10), and thus the memory package has a capacity of 16×64 GB=1 TB. Each memory package has a bandwidth of 16×66 GB/s=1.1 TB/s. To provide a bandwidth of approximately 3 TB/sec, three (3) memory packages would be required, which is practical.

To provide this bandwidth, the number of I/O per die is also increased. As described above, an 8 bit I/O has a speed of 4.8 G-transfers/s. If the number of I/O are increased by a factor of sixteen (16) to one hundred and twenty-eight (128) I/O, the I/O speed increases to 16×4.8 G-transfers/s=77 G-transfers/s, which is faster than the memory die data rate (66 GB/sec). In other words, by significantly increasing the number of I/O, the I/O does not limit the bandwidth.

The memory die bandwidth can be further increased by further reducing the physical page size to reduce read latency tR. For example, FIG. 5D is a diagram depicting a memory structure that includes thirty-two (32) planes: eight (8) planes in the x-direction (e.g., planes P00, P01, . . . , and P07) and four (4) planes in the y-direction (e.g., planes P07, P17, P27 and P37).

In an embodiment, each of planes P00, P01, P02, . . . , P36 and P37 is divided into two sub-planes. For example, plane P00 includes a first sub-plane $\mathbf{P00}_0$ and a second sub-plane $\mathbf{P00}_1$, a second sub-plane P01 includes a first sub-plane $\mathbf{P01}_0$ and a second sub-plane $\mathbf{P01}_1$, . . . , and a thirty-secondth sub-plane P37 includes a first sub-plane $\mathbf{P37}_0$ and a second sub-plane $\mathbf{P37}_1$.

In an embodiment, each of planes P00, P01, P02, . . . , P36 and P37 includes a logical page and a physical page size. In the embodiment of FIG. 5D, the physical page size is 2 kB/page, and each logical page includes two physical pages (i.e., 4 kB per logical page).

The structure of FIG. 5D can be derived from the structure of FIG. 5C by dividing each 4 kB plane into two 2 kB planes in the x-direction (8 planes in x-direction), and keeping the same number of planes by half in the y-direction (4 planes in y-direction), for a total of 32 planes. This is the same number of planes as the FIG. 5C embodiment. The total capacity of each die is 32 GB.

By cutting each word line in half (from 4 kB to 2 KB), the read latency tR decreases. In an embodiment, the read latency tR of the embodiment of FIG. 5D is 1.7 μsec (compared with a read latency tR of 15 μsec for the FIG. 5B embodiment and a read latency of 4 μsec for the FIG. 5C embodiment). The per-die bandwidth can be determined from read latency and the logical page size as follows:

$$BW = \frac{\left(4kB \times \frac{1024B}{kB}\right)}{1.7 \times 10^{-6}\ \text{sec}} \times 32\ \text{planes} = 77\ GB/s$$

In an embodiment, eight (8) memory die are included in a memory package, and thus the memory package has a capacity of 8×32 GB=256 GB. Each memory package has a bandwidth of 8×77 GB/s=616 GB/s. To provide a bandwidth of approximately 3 TB/sec, at least five (5) memory packages are provided.

To provide this bandwidth, the number of I/O per die must be increased. As described above, an 8 bit I/O has a speed of 4.8 G-transfers/s. If the number of I/O are increased by a factor of sixteen (16) to one hundred and twenty-eight (128) I/O, the I/O speed increases to 16×4.8 G-transfers/s=77 G-transfers/s, which is about the same as the memory die data rate (77 GB/sec).

A first technique to improve the power efficiency of the HBF package 1004 (depicted in FIG. 10) is to reduce the supply voltage. The power consumed by a NAND array is approximately equal to VCC×ICC, where VCC is the supply voltage and ICC is the supply current. For current NAND memory, a supply voltage of VCC=2.5 V is typically used. One technique for reducing power consumption (and thereby improve the power efficiency) is to reduce supply voltage VCC, such as VCC=1.2 V.

Figures 6A, 6B, 6C:
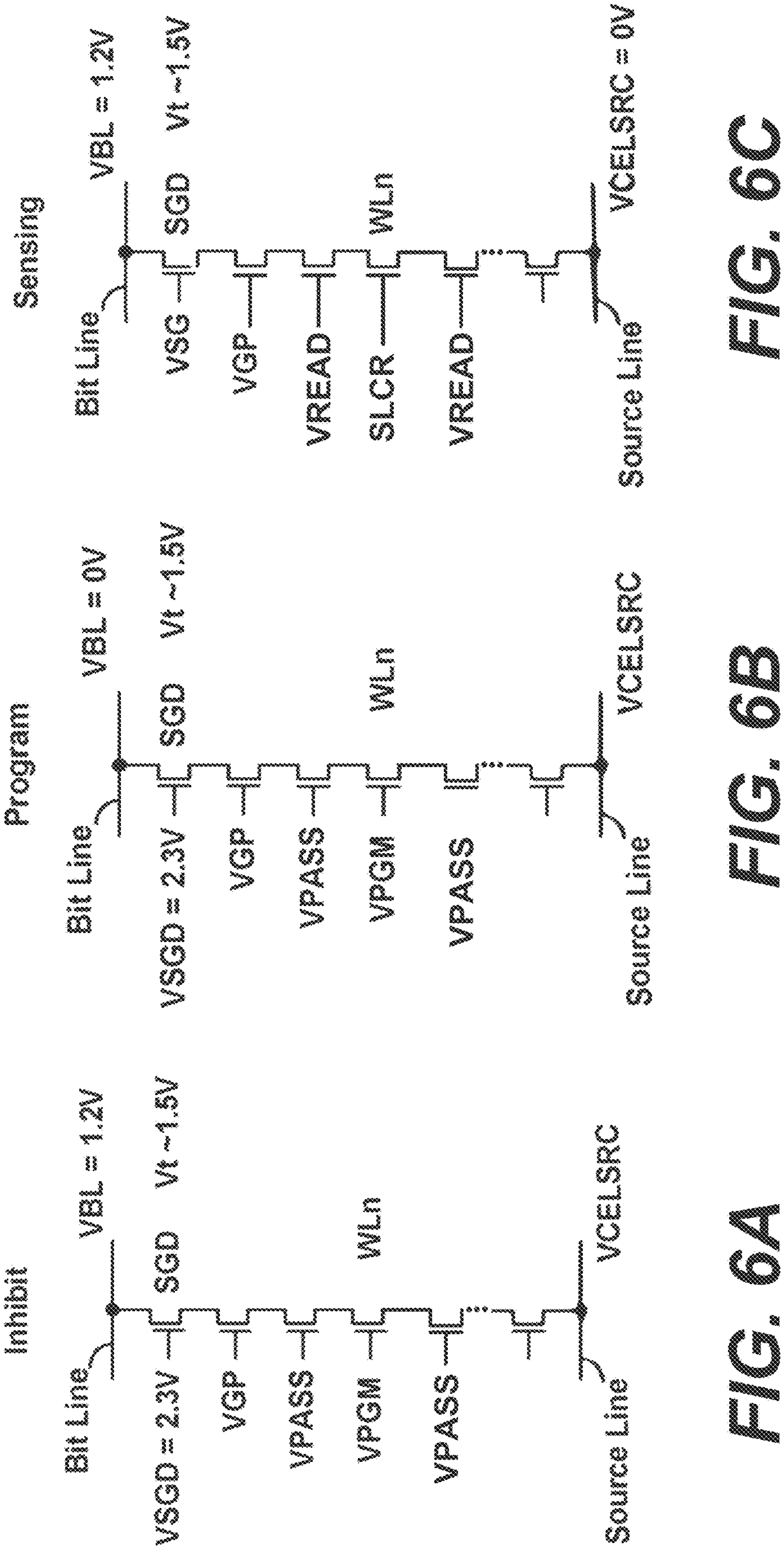
FIGS. 6A-6C depict an example NAND string during inhibit, program and sensing, respectively.

With the reduced supply voltage VCC, the memory device must still perform various functions, such as programming, inhibiting, and sensing. FIGS. 6A-6C depict an example NAND string during these three different memory operations. In particular FIGS. 6A-6C depict an example NAND string during inhibit, program and sensing, respectively.

For inhibit, depicted in FIG. 6A, the 1.2V VCC is provided to the inhibit bit line. This voltage needs to be high enough to cut off the unselected SGD transistors to provide the channel boosting to provide the inhibit operation. That is, (VSGD−VDD)<Vt.

Figures 8A, 8B:
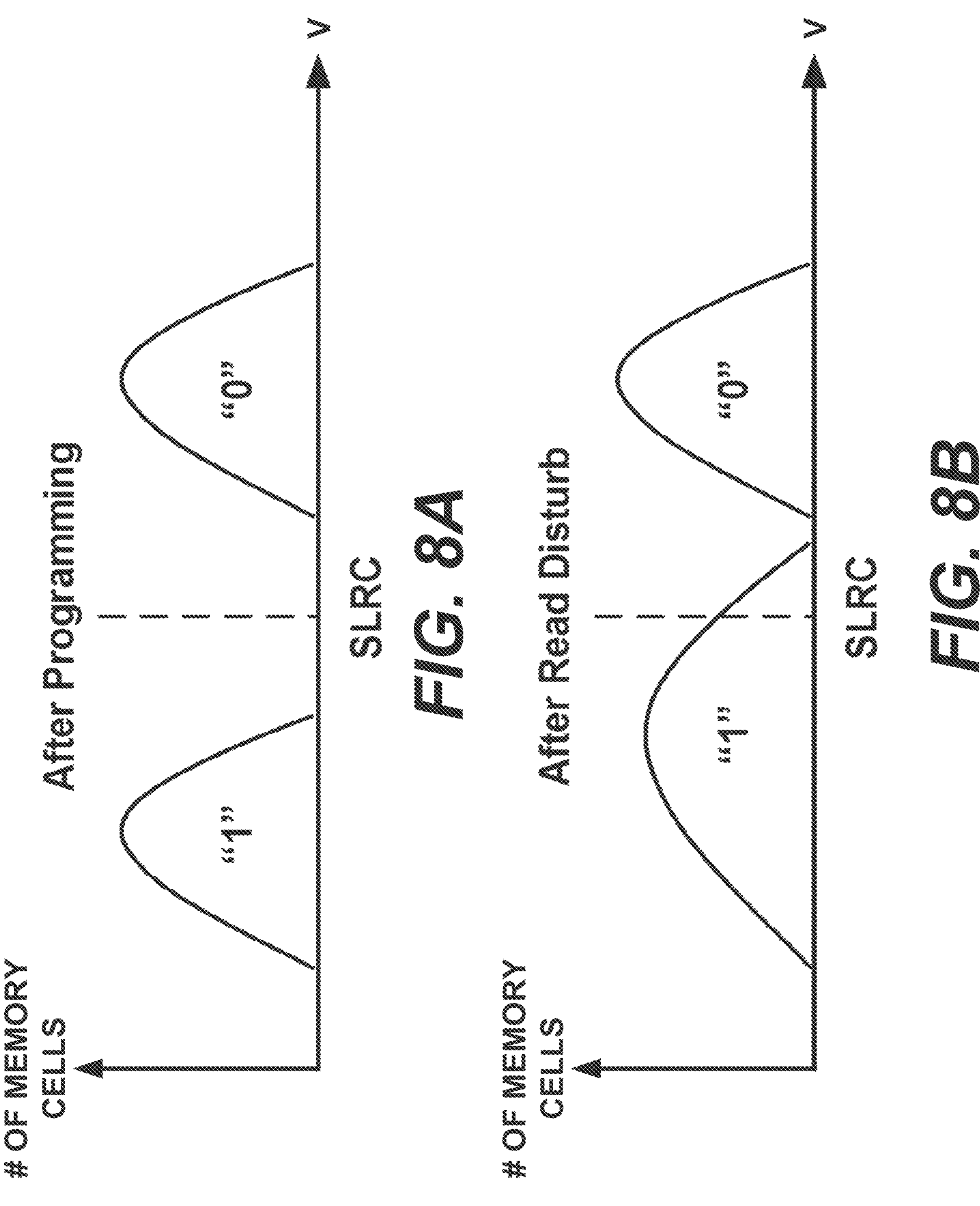
FIG. 8A depicts a threshold voltage distribution of a page of memory cells initially after programming.
FIG. 8B is depicts a threshold voltage distribution of the page of memory cells after experiencing significant read disturb.

For programming, depicted in FIG. 8B, a bit line voltage VBL=0 V is delivered to the channel. This requires that the bias VSGD on the SGD cells is greater than the threshold voltage of the SGD cells, VSGD>Vt. In an embodiment, the threshold voltage of the SGD cells is approximately 1.5 V.

Thus, for inhibit it is a requirement that (VSGD−VDD) <Vt, and for programming, it is a requirement that VSGD>Vt. From these two requirements the following can be derived:

$$VSGD > Vt \text{ upper tail}$$

$$VSGD < VDDSA + Vt \text{ lower tail}$$

In embodiments, the Vt lower tail is about 1.5 V and the Vt upper tail is about 1.9 V, and VDDSA is about 1.1 V. Thus, from the two conditions above:

$$1.9\ \text{V} < VSGD < 2.6\ \text{V}$$

For sensing, depicted in FIG. 6C, the bit line voltage VBL needs to provide enough drain-to-source voltage for the NAND string. In a conventional NAND device a source line voltage VCELSRC is set to 1 V. In such a scenario, the bit line voltage needs to provide VBLC (~0.2 V)+VCELSRC+a few transistor threshold voltages+some temperature compensation (TCO) voltage, which leads to approximately 1.5 V, which cannot be derived from VCC if VCC=1.2 V. Therefore, the source line voltage VCELSRC is instead set to 0 V in a scheme that is referred to herein as a "positive sensing" scheme. Because the source line voltage VCELSRC is set at the lower voltage, the bit line voltage needs to provide VBLC (~0.2 V)+0 V+a few transistor threshold voltages+some temperature compensation (TCO) voltage, which leads to approximately 0.5 V, which can be provided with the lower VCC=1.2 V. Thus, the VCC 1.2 V external power supply can offer the proper voltage for the HBF packages 1004.

A second technique to improve the power efficiency of the HBF packages 1004 is to reduce all internal voltages inside the NAND device. In an example embodiment the Vread, VDDSA, and VBL voltages are set as follows:

| | Conventional NAND | HBF |
|---|---|---|
| Vread (V) | 4.7 | 2.4 |
| VDDSA (V) | 2.2 | 1.1 |
| VBL (V) | 0.3 | 0.15 |
| Isense (nA) | 20 | 10 |

Figures 7A, 7B:
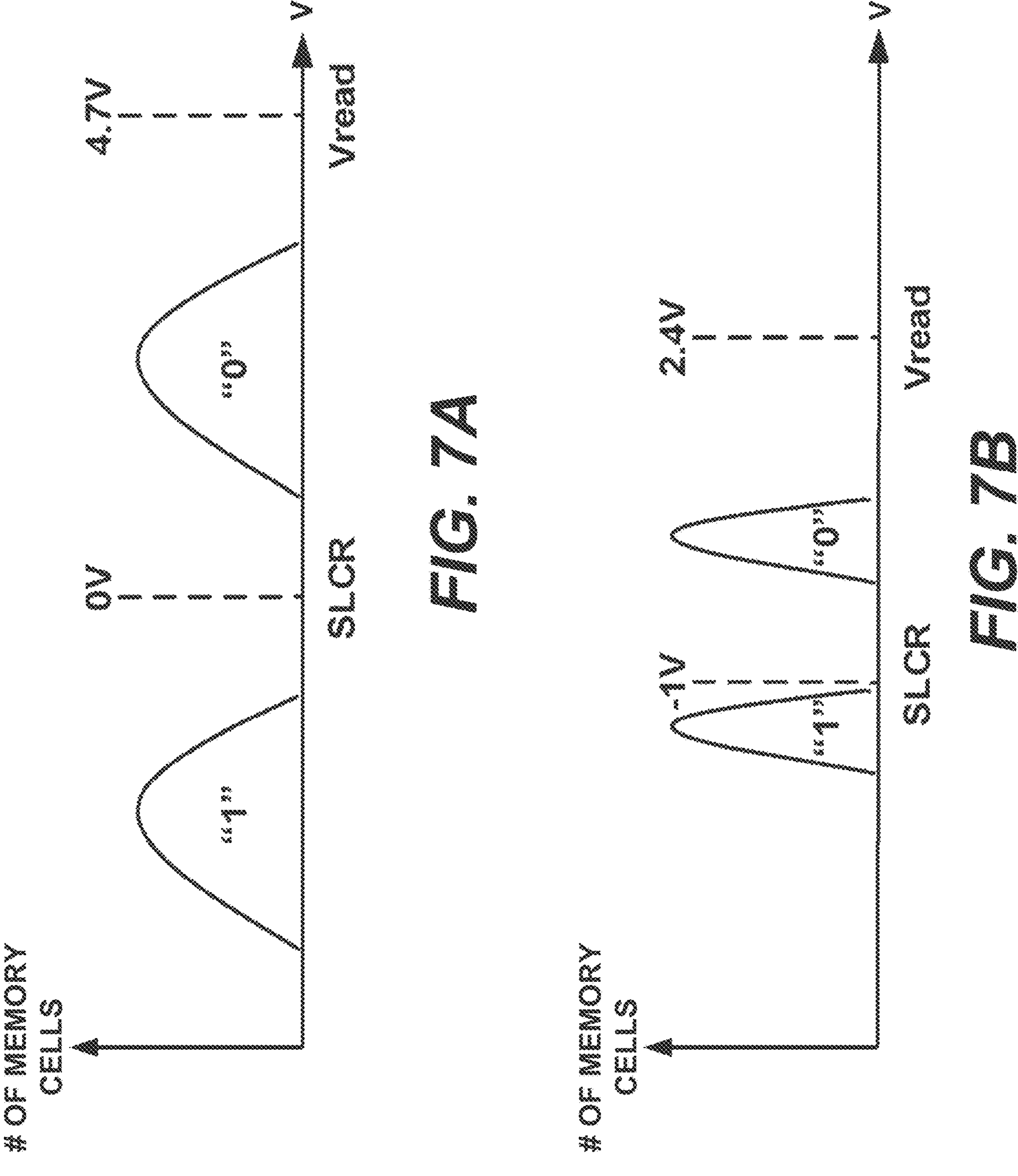
FIG. 7A depicts an example threshold voltage distribution of a page of NAND memory cells.
FIG. 7B depicts another example threshold voltage distribution of a page of NAND memory cells.

FIG. 7A depicts an example threshold voltage distribution of a NAND memory cell. In particular, the example threshold voltage distribution includes an erased state (e.g., "1") distribution and a programmed state (e.g., "0") distribution for a conventional NAND memory cell.

In the illustrated example, both threshold distributions are broad (e.g., such as may be achieved using a one program, zero verify "1P0V" program method) and there is a wide separation between the two threshold distributions. In the depicted example, a read verify level SLCR of 0 V is used and unselected word lines are biased at a voltage of Vread=4.7 V.

FIG. 7B depicts an example threshold voltage distribution of a page of memory cells in an HBF package 1004 (shown in FIG. 10). In particular, the example threshold voltage distribution includes an erased state (e.g., "1") distribution and a programmed state (e.g., "0"). Because programming operations in the HBF package 1004 are performed infrequently, during programming the threshold voltage distributions can be made very narrow, much narrower than the threshold voltage distribution of a conventional NAND memory device depicted in FIG. 7A.

In addition, the gap between the two distributions can be made very close together. By reducing the gap and the threshold voltage distribution width, the unselected word line voltage of Vread can be reduced from a conventional voltage, e.g., 4.7 V. In an exemplary embodiment, Vread is set to 2.4 V to further reduce power consumption.

In addition, in an exemplary embodiment of an HBF package 1004, the read verify level SLCR can be reduced from 0 V (e.g., in the middle of the two distributions in FIG. 7A). In an embodiment, read verify level SLCR is set at the upper tail of the erase distribution. For example, read verify level SLCR=−1 V or some other level. By setting read verify level SLCR at the upper tail of the erase distribution, the amount of overdrive between the erase state distribution and the read verify level SLCR is reduced, which in turn reduces power consumption during sensing.

As described above, the large language model processing is read intensive for the HBF packages 1004. As a result, the HBF packages 1004 will experience a lot of read disturb. When a selected memory cell is read, pass voltages VREAD are applied to the unselected word lines of a memory block, and a reference voltage SLCR is applied to the selected word line containing the selected memory cell (see FIG. 6C). A sensing operation is then performed to determine if a threshold voltage Vt of the selected memory cell is above or below the reference voltage VCG. This process can inadvertently induce a weak programming effect in certain memory cells of the memory block. Over time, if this process is repeated frequently without any intervening erase or program cycles, the accumulated charges in the memory cells can alter their threshold voltages Vt, potentially leading to bit errors.

For example, FIG. 8A depicts example threshold voltage Vt distributions of a plurality of memory cells (e.g., a page) in an example memory block immediately after programming. After a large number of reads in the memory block (e.g., one hundred thousand reads), the erase distribution will widen through repeated, unintentional weak programming. Thus, as illustrated in FIG. 8B, an upper tail of the erased data state “1” has encroached on a lower tail of the programmed data state “0.” As a result, due to read disturb, a margin (the voltage gap between the upper tail of the erased data state and the lower tail of the programmed data state) has shrunk considerably.

Conventionally, after severe read disturb is experienced in one block, the data is relocated to a new block (called “relocation”), and then the host can continue reading from the new block. Although this results in well-defined threshold voltage Vt distributions in the relocated block, this requires consuming a program-erase cycle to program the data to new block B, which hurts endurance. In addition, the block management function becomes more complicated because a logical-to-physical block table must keep track of the relocated data.

In one embodiment, read disturb can be detected by monitoring error rates that are detected and corrected by the ECC engine. Corrective action is then triggered in response to the error rate exceeding a predetermined threshold error rate. In another embodiment, the read cycles in a memory block since the data was programmed are counted. After the count reaches a predetermined threshold (e.g., one hundred thousand read cycles), then corrective action is triggered. In yet another embodiment, read is performed at two voltages that are between the upper tail of the erased data state and the lower tail of the programmed data state when the data is initially programmed (e.g., see FIG. 9A). A number of memory cells that have threshold voltages Vt between these two voltages is counted. If the number of memory cells in this voltage range is below a predetermined threshold, then the memory cells have not experienced significant read disturb yet. On the other hand, if the number of memory cells in this voltage range is above the predetermined threshold, then it is determined that the memory cells have experienced significant read disturb.

An aspect of the present disclosure is related to a technique for “in-place” refreshing the data after a high amount of read disturb has occurred to thereby increase the threshold voltage Vt margin between the erased data state (“1” in FIGS. 8A and 8B) and the programmed data state (“0” in FIGS. 8A and 8B). In embodiments, the in-place refreshing technique may be implemented by any one or any combination of the memory controller 104; the state machine 228; all or a portion of the system control logic 208; all or a portion of the row control circuitry 204; all or a portion of the column control circuitry 216; a microcontroller; a microprocessor; and/or any other similarly functional circuits.

Figures 9A, 9B:
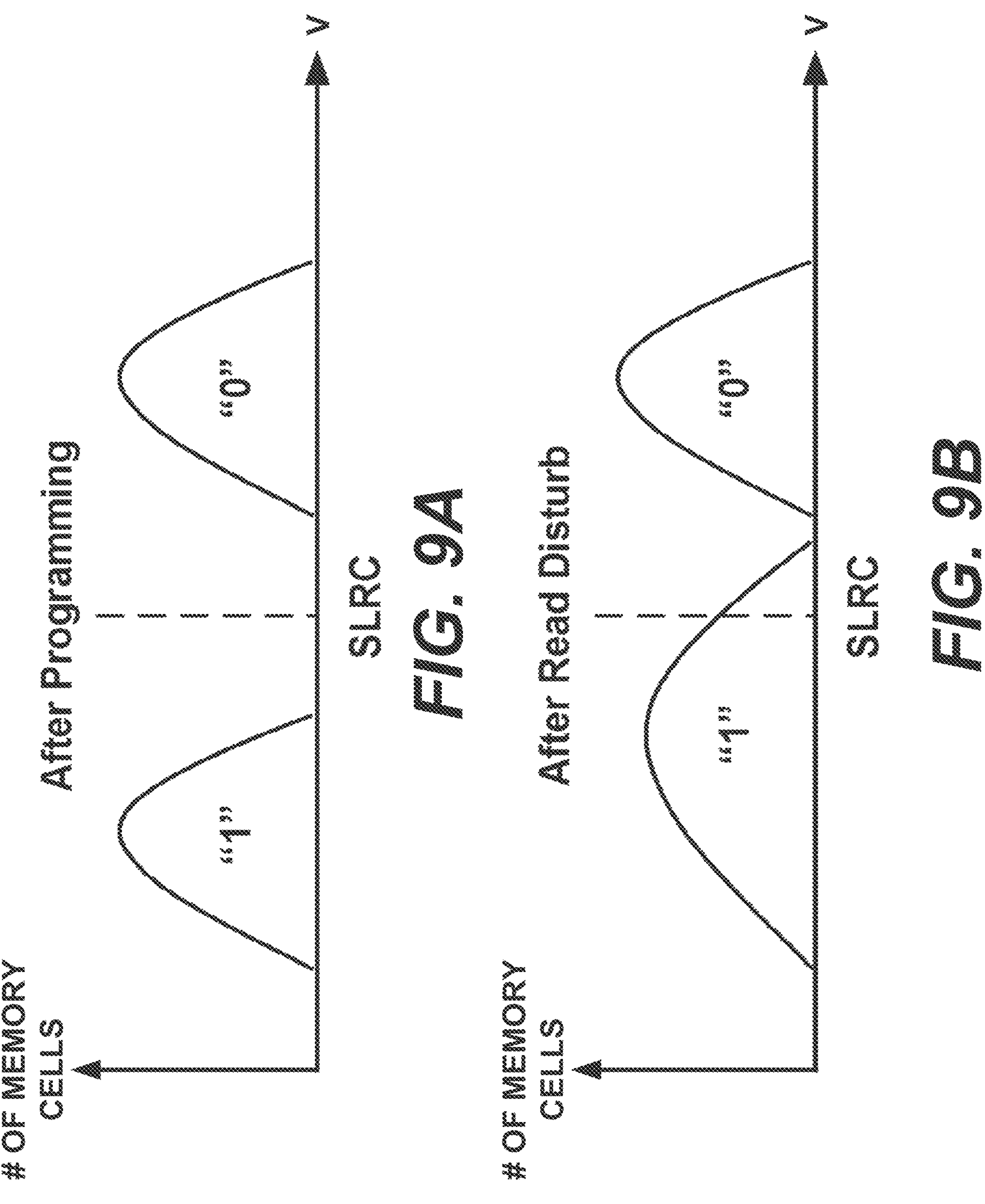
FIG. 9A depicts a threshold voltage distribution of a page of memory cells initially after programming.
FIG. 9B depicts a threshold voltage distribution of the same page of memory cells as FIG. 9A but after significant read disturb.

FIG. 9A depicts a threshold voltage Vt distribution of a page of memory cells in a memory block shortly after programming, and FIG. 9B depicts the threshold voltage Vt distribution of the same page of memory cells after a significant amount of read disturb has occurred. According to the in-place refreshing technique, in response to a detection that the memory cells have experienced a certain amount of read disturb (for example, by detecting the read disturb or by a read cycle count exceeding a predetermined threshold), the memory cells in the programmed data state (“1” in FIGS. 9A and 9B) are programmed to a higher threshold voltage Vt level, and the control gate voltage VCG employed during a sensing operation is increased from SLCR (illustrated in FIGS. 9A and 9B) to SLCR_2, which is located between the upper tail of the erased data state (“1”) and the programmed data state (“0”). In other words, the programmed data state has been advanced to increase the threshold voltage Vt margin.

Programming the memory cells in the programmed data state (“0”) occurs on a word line-by-word line basis from one side of the memory block towards an opposite side of the memory block. Programming can include one or more program loops, each including a programming pulse (hereinafter referred to as a VPGM pulse) and (optionally) a verify pulse. In some embodiments, programming during an in-place refresh operation includes one program loop with a single VPGM pulse and zero verify pulses (1P0V). In some other embodiments, the in-place refresh operation can include multiple program loops, each with a VPGM pulse and a verify operation (nPnV). In some embodiments, the programming voltage VPGM increases by a fixed step size dVpgm between program loops.

FIG. 6B depicts the voltages applied to an example NAND string that contains a memory cell being refreshed (specifically, any of the memory cells in the programmed data state) during a VPGM pulse. As illustrated, the programming voltage is applied to a selected word line WLn containing the memory cell to be refreshed, and a very low voltage (VBL=0 V) is applied to the bit line coupled to this NAND string. The large gate to channel difference causes some electrons to navigate into the charge trapping material of the selected memory cell, thereby increasing its threshold voltage Vt. Turning now to FIG. 6C, for memory cells where programming is not desired (specifically, and of the memory cells in the erased data state), a relatively higher inhibit voltage (VBL=1.2 V) is applied to the bit line coupled to the respective NAND string such that there is a relatively low gate to channel voltage and the selected memory cell is inhibited from programming.

Figures 9C, 9D:
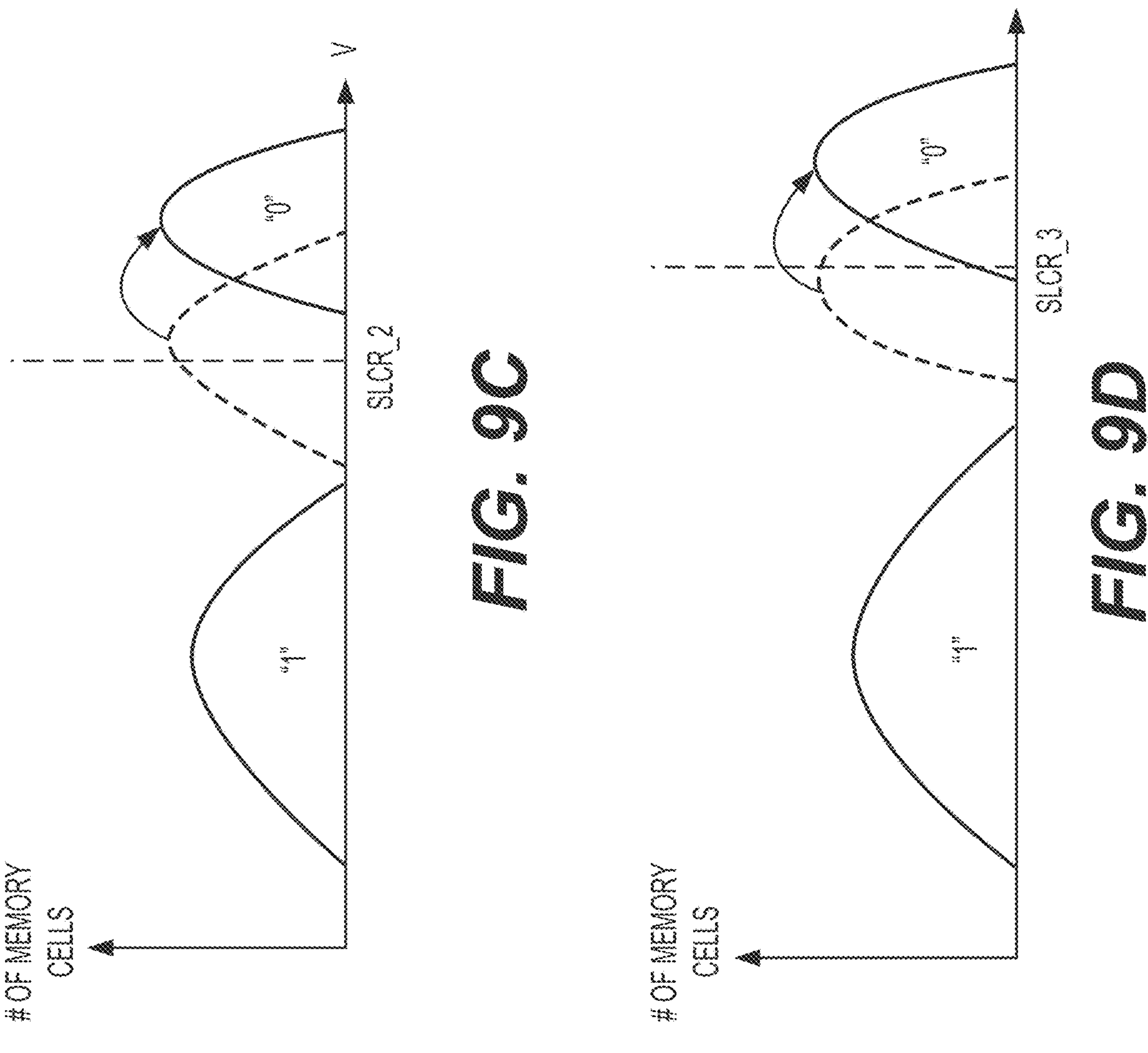
FIG. 9C depicts a threshold voltage distribution of the same page of memory cells as FIGS. 9A and 9B but after a data refresh operation.
FIG. 9D depicts a threshold voltage distribution of the same page of memory cells as FIGS. 9A-C but after a second data refresh operation.

Turning now to FIG. 9D, if the memory block experiences further read disturb, the memory cells in the programmed data state (“0”) can be further programmed to further increase their threshold voltages Vt and thereby increase the threshold voltage Vt margin between the erased data state ("1") and the programmed data state ("0"). The control gate voltage employed during read is then adjusted to SLCR_3, which is between the upper tail of the erased data state ("1") and the lower tail of the programmed data state ("1"). This process can be repeated multiple times within an acceptable threshold voltage Vt window.

Figure 11:
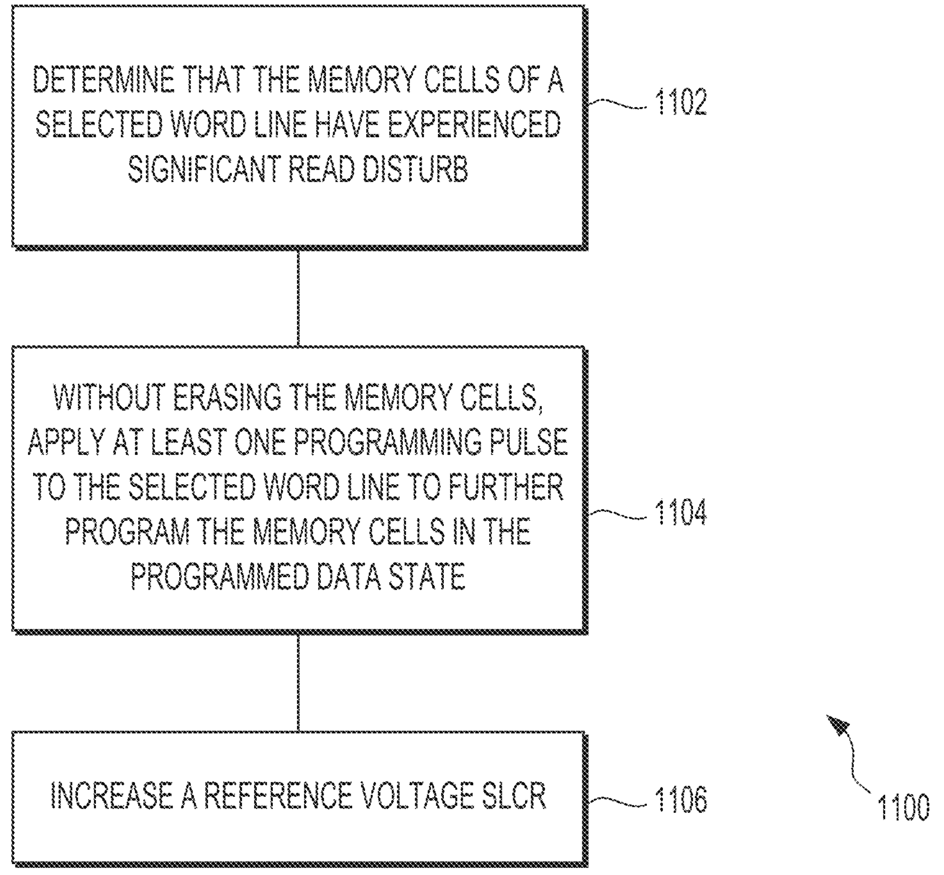
FIG. 11 is a flow chart depicting the steps of refreshing data in a memory block according to an example embodiment.

Turning now to FIG. 11, a flow chart 1100 is provided depicting the steps of in-place refreshing data according to an exemplary embodiment of the present disclosure. These steps could be performed by the controller; a processor or processing device or any other circuitry, executing instructions stored in memory; and/or other circuitry described herein that is specifically configured/programmed to execute the following steps.

At step 1102, it is determined that the memory cells of a first sub-block (for example, the lower sub-block SB0 illustrated in FIGS. 9A, 9B, and 9F) have experienced significant read disturb. This could include detecting the read disturb or establishing that a read cycle count since the data was programmed into the first sub-block exceeds a predetermined threshold.

At step 1104, without erasing the memory cells of the selected word line, at least one VPGM pulse is applied to the selected word line to further program the memory cells in the programmed data state to higher threshold voltages Vt and thereby increase a threshold voltage Vt margin between the erased data state and the programmed data state.

At step 1106, a reference voltage SLCR for use during a read operation is increased form a first level to a higher second level.

This process can then proceed sequentially through all of the word lines in the memory block until all of the memory cells have been refreshed.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A method of operating a memory device, comprising steps of:

providing a memory device that includes a memory block with an array of memory cells that are arranged in a plurality of word lines, the memory cells being programmed to one bit per memory cell with each memory cell being either in an erased data state or a programmed data state;

determining that the memory cells have experienced significant read disturb;

without erasing the memory cells, programming the memory cells in the programmed data state directly to higher threshold voltages to increase a threshold voltage margin between the memory cells in the erased data state and the memory cells in the programmed data state; and setting a reference voltage SLCR for use during read operations from a first level to a higher second level following the step of programming the memory cells in the programmed data state directly to the higher threshold voltages.

2. The method as set forth in claim 1, further including steps of counting a number of read cycles to establish a read cycle count; and comparing the read cycle count to a predetermined threshold; and wherein the step of determining that the memory cells have experienced significant read disturb occurs in response to the read cycle count exceeding the predetermined threshold.

3. The method as set forth in claim 1 wherein the step of programming the memory cells in the programmed data state directly to the higher threshold voltages includes:

applying a programming voltage to a selected word line;

setting a plurality of bit lines that are electrically coupled with the memory cells of the selected word line and that are in the programmed data state at very low voltages; and setting a plurality of bit lines that are electrically coupled with the memory cells of the selected word line and that are in the erased data state at inhibit voltages.

4. The method as set forth in claim 1, wherein the step of programming the memory cells in the programmed data state directly to the higher threshold voltages includes a single programming pulse and no verify operations or includes multiple programming pulses and verify operations.

5. A method of operating a memory device, comprising steps of:

providing a memory device that includes a memory block with an array of memory cells that are arranged in a plurality of word lines, the memory cells being programmed to one bit per memory cell with each memory cell being either in an erased data state or a programmed data state;

determining that the memory cells have experienced significant read disturb;

without erasing the memory cells, programming the memory cells in the programmed data state directly to higher threshold voltages to increase a threshold voltage margin between the memory cells in the erased data state and the memory cells in the programmed data state; and wherein the step of determining that the memory cells have experienced significant read disturb occurs in response to a determination that a count of memory cells in a voltage range that is below a voltage range associated with the programmed data state is greater than a predetermined threshold.

6. A memory device, comprising:

a memory block with an array of memory cells that are arranged in a plurality of word lines, the memory cells being programmed to one bit per memory cell with each memory cell being either in an erased data state or a programmed data state; and circuitry configured to:

determine that the memory cells have experienced significant read disturb;

without erasing the memory cells, program the memory cells in the programmed data state directly to higher threshold voltages to increase a threshold voltage margin between the memory cells in the erased data state and the memory cells in the programmed data state, and set a reference voltage SLCR for use during read operations from a first level to a higher second level after programming the memory cells in the programmed data state directly to the higher threshold voltages.

7. The memory device as set forth in claim 6, wherein the circuitry is configured to count a number of read cycles to establish a read cycle count; and compare the read cycle count to a predetermined threshold; and wherein the circuitry determines that the memory cells have experienced significant read disturb in response to the read cycle count exceeding the predetermined threshold.

8. The memory device as set forth in claim 6 wherein when programming the memory cells in the programmed data state directly to the higher threshold voltages, the circuitry:

applies a programming voltage to a selected word line;

sets a plurality of bit lines that are electrically coupled with the memory cells of the selected word line and that are in the programmed data state at very low voltages; and sets a plurality of bit lines that are electrically coupled with the memory cells of the selected word line and that are in the erased data state at inhibit voltages.

9. The memory device as set forth in claim 6, wherein the circuitry is configured to count a number of memory cells that have threshold voltages in a voltage range that is below a voltage range associated with the programmed data state, compare the count of memory cells that have threshold voltages in the voltage range that is below the voltage range associated with the programmed data state to a predetermined threshold, and determine that the memory cells have experienced significant read disturb in response to the count of memory cells being greater than the predetermined threshold.

10. The memory device as set forth in claim 6, wherein when programming the memory cells in the programmed data state directly to the higher threshold voltages, the circuitry applies a single programming pulse to a selected word line without a following verify operation or applies multiple programming pulses to the selected word line with following verify operations.

11. A computing system, comprising:

a processor unit;

a plurality of flash memory packages in electrical communication with the processor unit;

at least one of the flash memory packages including a memory block with an array of memory cells that are arranged in a plurality of word lines, the memory cells being programmed to one bit per memory cell with each memory cell being either in an erased data state or a programmed data state; and the at least one of the flash memory packages further including circuitry that is configured to:

determine that the memory cells have experienced significant read disturb, without erasing the memory cells, program the memory cells in the programmed data state directly to higher threshold voltages to increase a threshold voltage margin between the memory cells in the erased data state and the memory cells in the programmed data state, and set a reference voltage SLCR for use during read operations from a first level to a higher second level after programming the memory cells in the programmed data state directly to the higher threshold voltages.

12. The computing system as set forth in claim 11, wherein the circuitry is configured to count a number of read cycles to establish a read cycle count; and compare the read cycle count to a predetermined threshold; and wherein the circuitry determines that the memory cells have experienced significant read disturb in response to the read cycle count exceeding the predetermined threshold.

13. The computing system as set forth in claim 11, wherein when programming the memory cells in the programmed data state directly to the higher threshold voltages, the circuitry:

applies a programming voltage to a selected word line;

sets a plurality of bit lines that are electrically coupled with the memory cells of the selected word line and that are in the programmed data state at very low voltages; and sets a plurality of bit lines that are electrically coupled with the memory cells of the selected word line and that are in the erased data state at inhibit voltages.

14. The computing system as set forth in claim 11, wherein the circuitry is configured to count a number of memory cells that have threshold voltages in a voltage range that is below a voltage range associated with the programmed data state, compare the count of memory cells that have threshold voltages in the voltage range that is below the voltage range associated with the programmed data state to a predetermined threshold, and determine that the memory cells have experienced significant read disturb in response to the count of memory cells being greater than the predetermined threshold.

15. The computing system as set forth in claim 11, wherein the plurality of flash memory packages are able to electrically communicate with the processor unit at rates of greater than 3 TB/s.

16. The computing system as set forth in claim 11, wherein the flash memory packages receive supply voltages that are no greater than 1.2 V.

17. The computing system as set forth in claim 11, wherein when programming the memory cells in the programmed data state directly to the higher threshold voltages, the circuitry applies a single programming pulse to a selected word line without a following verify operation or applies multiple programming pulses to the selected word line with verify operations.

* * * * *